(12) United States Patent
Ogawa et al.

(10) Patent No.: US 11,165,014 B2
(45) Date of Patent: Nov. 2, 2021

(54) SEMICONDUCTOR DEVICE

(71) Applicant: ABLIC inc., Chiba (JP)

(72) Inventors: Yohei Ogawa, Chiba (JP); Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/825,008

(22) Filed: Mar. 20, 2020

(65) Prior Publication Data

US 2020/0313079 A1  Oct. 1, 2020

(30) Foreign Application Priority Data

Mar. 29, 2019 (JP) .............................. JP2019-065217
Jan. 27, 2020 (JP) .............................. JP2020-010560

(51) Int. Cl.
  *H01L 43/04* (2006.01)
  *H01L 43/06* (2006.01)

(52) U.S. Cl.
  CPC ............ *H01L 43/04* (2013.01); *H01L 43/065* (2013.01)

(58) Field of Classification Search
  CPC ........ G01R 33/06–077; G01R 33/0005; G01R 33/0017; H01L 43/00–14; H01L 43/04
  See application file for complete search history.

(56) References Cited

U.S. PATENT DOCUMENTS

| 9,116,192 B2 | 8/2015 | Stahl-Offergeld et al. |
| 2012/0019239 A1* | 1/2012 | Decitre ................ G01N 27/904 324/239 |
| 2015/0022198 A1* | 1/2015 | David .................. G01R 33/093 324/251 |

* cited by examiner

*Primary Examiner* — Jose R Diaz
(74) *Attorney, Agent, or Firm* — Crowell & Moring LLP

(57) ABSTRACT

A semiconductor device includes a semiconductor substrate; a vertical Hall element including a magnetosensitive portion, and formed in the semiconductor substrate; and an excitation wiring provided above a surface of the semiconductor substrate and apart from the magnetosensitive portion. The excitation wiring is formed of a single wiring with a plurality of turns. The excitation wiring includes a plurality of main wiring portions arranged side by side, and apart from one another in an overlapping region that overlaps the magnetosensitive portion as viewed in plan view from a direction orthogonal to the surface of the semiconductor substrate; and auxiliary wiring portions connecting each of the plurality of main wiring portions to one another in series.

6 Claims, 14 Drawing Sheets

SEMICONDUCTOR DEVICE

RELATED APPLICATIONS

This application claims priority to Japanese Patent Application Nos. 2019-065217, filed on Mar. 29, 2019, and 2020-010560, filed on Jan. 27, 2020, the entire contents of which are incorporated herein by reference.

BACKGROUND OF THE INVENTION

1. Field of the Invention

The present invention relates to a semiconductor device.

2. Description of the Related Art

There have been known, for example, semiconductor devices using Hall elements as magnetic sensors. The Hall elements have been used in various applications as magnetic sensors capable of detecting a position or an angle in a non-contact manner. The Hall elements include vertical Hall elements and horizontal Hall elements. Of those, a horizontal Hall element is a magnetic sensor configured to detect a magnetic field component perpendicular to the element surface. On the other hand, a vertical Hall element is a magnetic sensor configured to detect a magnetic field component parallel to the element surface. Further, there have been proposed other magnetic sensors in which a horizontal Hall element and a vertical Hall element are combined to two-dimensionally or three-dimensionally detect a magnetic field.

Nevertheless, the above-mentioned vertical Hall element is affected more easily by manufacturing variation than the horizontal Hall element and is more liable to exhibit large variations in sensitivity and offset voltage characteristic than the horizontal Hall element.

The following method has been proposed to calibrate such characteristic variations. That is, an excitation wiring is disposed near the vertical Hall element, and a magnetic field of a predetermined intensity (hereinafter referred to as "calibration magnetic field") is applied to a magnetosensitive portion of the vertical Hall element by a constant current flowing through the excitation wiring to estimate a sensitivity of the magnetosensitive portion (see, for example, U.S. Pat. No. 9,116,192). That is, in the invention described in U.S. Pat. No. 9,116,192 the actual sensitivity of the magnetosensitive portion is estimated by changing the intensity of the calibration magnetic field and measuring a change in Hall voltage generated from the vertical Hall element.

Further, according to the invention described in U.S. Pat. No. 9,116,192, the center of the excitation wiring is laterally offset from the center of the magnetosensitive portion in the vertical Hall element, that is, the center of the excitation wiring is laterally spaced apart from the center of the magnetosensitive portion. This arrangement reduces variation in intensity of the calibration magnetic field generated by the excitation wiring due to variation in, for example, the width of the excitation wiring caused by process fluctuation in manufacturing the semiconductor device.

However, with the invention described in U.S. Pat. No. 9,116,192, the excitation wiring is laterally spaced apart from the magnetosensitive portion. That is, since the intensity of the calibration magnetic field generated by the current flowing through the excitation wiring is inversely proportional to the distance from the excitation wiring, the larger the distance between the magnetosensitive portion and the excitation wiring becomes, the lower the intensity of the calibration magnetic field applied to the magnetosensitive portion becomes.

As the intensity of the calibration magnetic field applied to the magnetosensitive portion becomes lower, the change in Hall voltage generated from the vertical Hall element becomes smaller. Thus, with the invention described in U.S. Pat. No. 9,116,192, even though the variation in the intensity of the calibration magnetic field applied to the magnetosensitive portion is reduced, accuracy of estimating the actual sensitivity of the magnetosensitive portion lowers since the intensity of the calibration magnetic field decreases.

As a conceivable improvement, the amount of current flowing through the excitation wiring is increased, to thereby increase the intensity of the calibration magnetic field applied to the magnetosensitive portion.

In some cases, however, it may not be always possible to increase the amount of current flowing through the excitation wiring to a level high enough to obtain a desired intensity of the calibration magnetic field due to restrictions, for example, on the physical property of the excitation wiring and the capacity of the connected power supply. Further, the larger the amount of current flowing through the excitation wiring becomes, the larger the amount of heat generated by the excitation wiring becomes.

Further, with the invention described in U.S. Pat. No. 9,116,192, since the center of the excitation wiring is laterally offset from the center of the magnetosensitive portion by a large amount, peripheral circuits disposed around the magnetosensitive portion are close to the excitation wiring. In this case, the peripheral circuits are affected by the heat from the nearby excitation wiring. Specifically, since the heat generation in the excitation wiring causes asymmetric temperature distribution across the peripheral circuits, characteristics of the peripheral circuits fluctuate. Accordingly, the increase of current flowing through the excitation wiring also leads to the lowering of the accuracy in estimating the actual sensitivity of the magnetosensitive portion.

Here, even though it is possible to suppress the characteristic fluctuation of the peripheral circuits through increase of the distance between the excitation wiring and the peripheral circuits, it is not practical because the area required for the semiconductor device is increased to increase the cost.

SUMMARY OF THE INVENTION

The present invention has been made to provide a semiconductor device which increases an intensity of a calibration magnetic field applied to a magnetosensitive portion, and also suppresses variation in magnetic field intensity and characteristic fluctuation of peripheral circuits caused by heat.

According to an embodiment of the present invention, there is provided a semiconductor device including a semiconductor substrate; a vertical Hall element having a magnetosensitive portion, and formed in the semiconductor substrate; and an excitation wiring provided above a surface of the semiconductor substrate and apart from the magnetosensitive portion. The excitation wiring is formed of a single wiring with a plurality of turns and includes a plurality of main wiring portions which is arranged side by side, and are apart from one another in an overlapping region that overlaps the magnetosensitive portion as viewed in plan view from a direction orthogonal to the surface of the semiconductor substrate; and auxiliary wiring portions connecting each of the plurality of main wiring portions to one another in series.

According to the semiconductor device of the present invention, the excitation wiring includes the plurality of main wiring portions arranged side by side, and apart from one another on the surface of the semiconductor substrate, and the plurality of main wiring portions is connected in series to form a single wiring with which it is possible to increase the intensity of the calibration magnetic field applied to the magnetosensitive portion, and also possible to suppress variation in magnetic field intensity and characteristic fluctuation of the peripheral circuits caused by heat.

DETAILED DESCRIPTION OF THE PREFERRED EMBODIMENTS

Now, embodiments of the present invention are described in detail below with reference to the accompanying drawings.

In some of the drawings referred to in the following description, characteristic portions are enlarged for convenience and easy understanding thereof, and each component is not necessarily drawn to scale. Further, left, right, upper, and lower directions, or other directions used in the following description are defined based on the illustration.

First Embodiment

Figure 1:
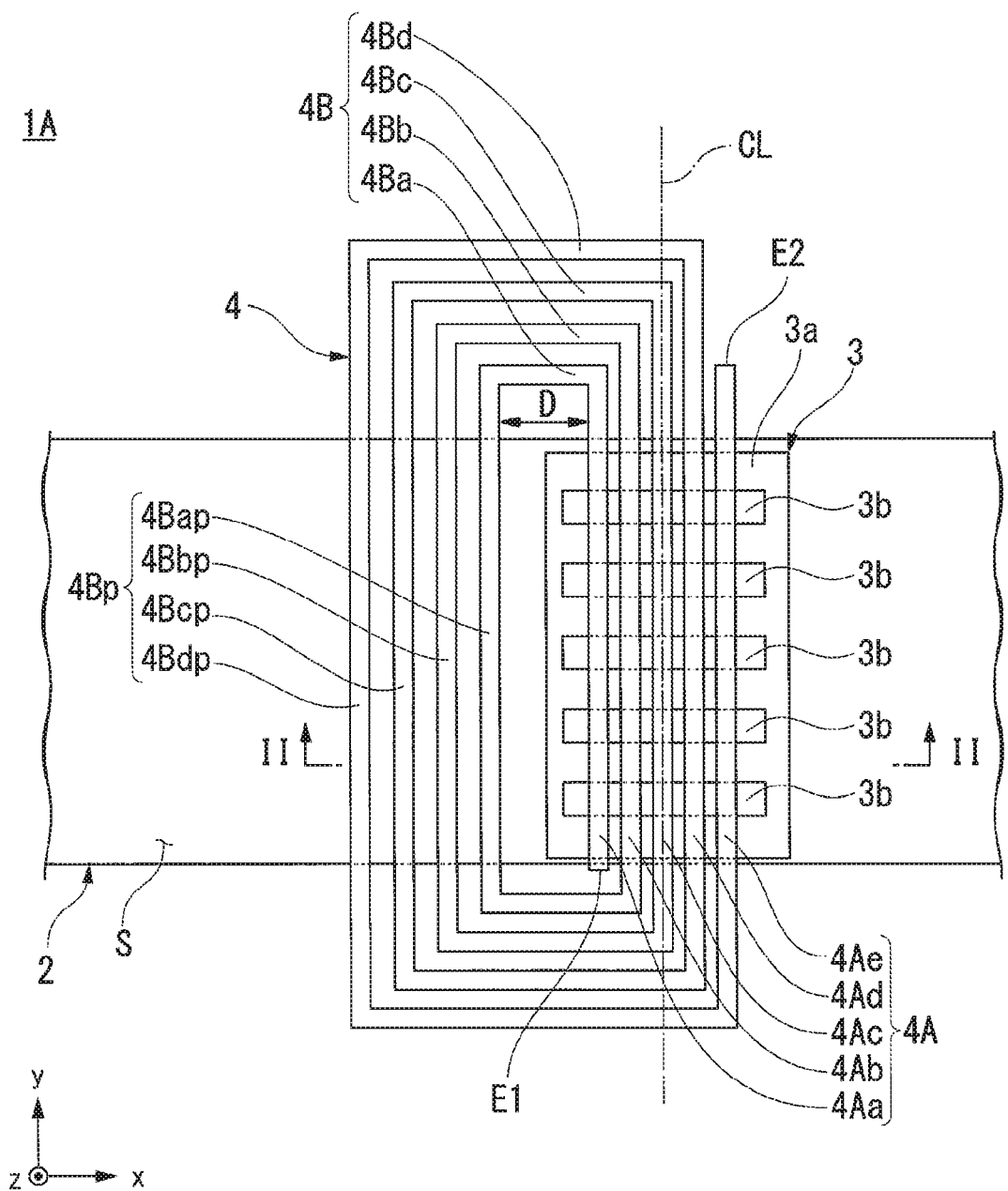
FIG. 1 is a plan view for illustrating a configuration of a semiconductor device according to the first embodiment of the present invention.
Figure 2:
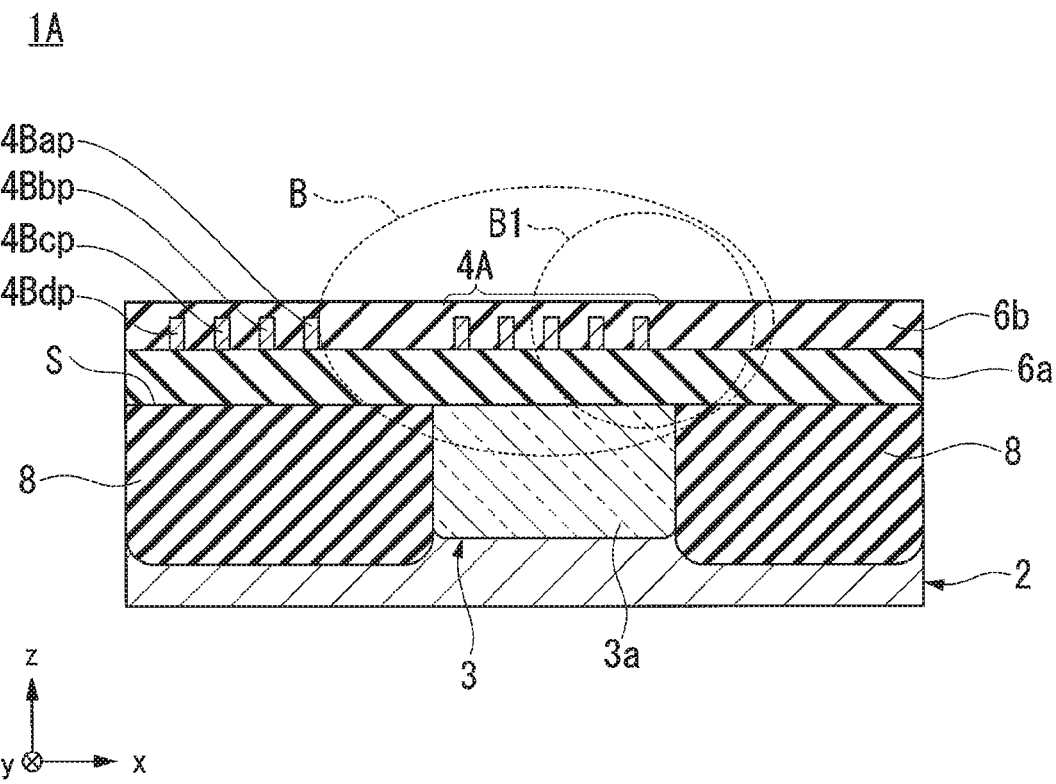
FIG. 2 is a sectional view taken along the line II-II of the semiconductor device according to the first embodiment.

FIG. 1 is a plan view for illustrating a configuration of a semiconductor device 1A according to the first embodiment of the present invention. FIG. 2 is a sectional view of the semiconductor device 1A taken along the line II-II of FIG. 1 (II-II sectional view). In FIG. 1, insulating layers 6a and 6b to be described later are omitted for ease of description.

As illustrated in FIG. 1 and FIG. 2, the semiconductor device 1A includes a semiconductor substrate 2, a vertical Hall element 3 which includes a magnetosensitive portion 3a and is formed in the semiconductor substrate 2, and an excitation wiring 4 provided above the surface S of the semiconductor substrate 2 and apart from the magnetosensitive portion 3a. The semiconductor substrate 2 has the first conductivity type which is one of a P type and an N type (for example, P type). The semiconductor substrate 2 includes the vertical Hall element 3 and a diffusion layer 8. A direction orthogonal to the surface S of the semiconductor substrate 2 is herein referred to as "depth direction". The depth direction refers to a direction parallel to a z direction of a three-dimensional xyz orthogonal coordinate system.

The vertical Hall element 3 includes the magnetosensitive portion 3a which is formed to detect a magnetic field component, and a plurality of electrodes 3b (in the first embodiment, five) provided above the magnetosensitive portion 3a. The electrodes 3b have a predetermined size (width) in a width direction and are arranged side by side in a length direction. In this example, the width direction refers to a direction perpendicular to the depth direction, and parallel to the x direction. Further, the length direction refers to a direction perpendicular to both the depth direction and the width direction, and parallel to the y direction.

The magnetosensitive portion 3a is, for example, a semiconductor layer, which is also called a well, formed by implanting impurities of the second conductivity type which is one of the P type and the N type (for example, N type) into the semiconductor substrate 2 of the first conductivity type which is the other one of the P type and the N type (for example, P type). The magnetosensitive portion 3a is formed three-dimensionally with predetermined length, width, and depth. Transverse and longitudinal directions of the magnetosensitive portion 3a illustrated in FIG. 1 are herein referred to as "width direction" and "length direction", respectively. The width direction refers to a direction parallel to the y direction of the three-dimensional xyz orthogonal coordinate system, and the length direction refers to a direction parallel to the x direction thereof.

The magnetosensitive portion 3a has a function of detecting a magnetic field component in the width direction. On the magnetosensitive portion 3a, the electrodes 3b each having a predetermined size in the width direction are arranged side by side at predetermined intervals in the length direction. With the magnetic field component in the width direction applied to the magnetosensitive portion 3a, a Hall voltage corresponding to the magnetic field component is generated between the electrodes 3b of the vertical Hall element 3.

The vertical Hall element 3 is electrically isolated from another region of the semiconductor substrate 2 by the diffusion layer 8 surrounding the magnetosensitive portion 3a. The semiconductor substrate 2 includes, in the another region, peripheral circuits, for example, a circuit for processing an output signal from the vertical Hall element 3, a circuit for supplying current to the vertical Hall element 3, and a circuit for compensating the characteristic of the vertical Hall element 3 by the calibration magnetic field.

On the surface S of the semiconductor substrate 2, the insulating layers 6a and 6b are laminated. The insulating layer 6a is formed to cover the surface S of the semiconductor substrate 2. The excitation wiring 4 is provided on the insulating layer 6a. The insulating layer 6b is formed on the insulating layer 6a to cover the excitation wiring 4.

The insulating layers 6a and 6b have a function of electrical isolation from other members. With the function of electrical isolation, the insulating layer 6a is electrically isolated from the adjacent, underlying semiconductor substrate 2 and the adjacent, overlying insulating layer 6b. Further, the insulating layer 6b is electrically isolated from the adjacent, underlying insulating layer 6a. The excitation wiring 4 is electrically isolated from the vertical Hall element 3 by the insulating layers 6b and 6a. Further, the excitation wiring 4 is provided above the surface S of the semiconductor substrate 2 and apart from the magnetosensitive portion 3a.

The excitation wiring 4 has end portions E1 and E2 and is formed as a single wiring which extends from the end portion E1 to the end portion E2. The end portions E1 and E2 are connected to a power supply (not shown).

The excitation wiring 4 includes a plurality of main wiring portions 4A and a plurality of auxiliary wiring portions 4B. The plurality of main wiring portions 4A is a portion of the excitation wiring 4 and overlaps the magnetosensitive portion 3a as viewed in plan view from the direction orthogonal to the surface S of the semiconductor substrate 2. (Hereinafter "as viewed in plan view from the direction orthogonal to the surface S of the semiconductor substrate 2" is abbreviated simply as "as viewed in plan view" throughout the "Detailed Description Of The Preferred Embodiments".) That is, the plurality of main wiring portions 4A is arranged to overlap the magnetosensitive portion 3a as viewed in plan view (direction from +z to −z).

The region overlapping the magnetosensitive portion 3a as viewed in plan view is herein referred to as "overlapping region". Further, a region outside the magnetosensitive portion 3a as viewed in plan view, that is, a region of the plane other than the overlapping region as viewed in plan view, is referred to as "non-overlapping region".

The plurality of main wiring portions 4A includes main wiring portions 4Aa, 4Ab, 4Ac, 4Ad, and 4Ae arranged in this order starting from the end portion E1 side. The main wiring portions 4Aa, 4Ab, 4Ac, 4Ad, and 4Ae are different portions of the same excitation wiring 4, and individually extend in the length direction. The main wiring portions 4Aa, 4Ab, 4Ac, 4Ad, and 4Ae are arranged side by side, and apart from one another, along the width direction of the magnetosensitive portion 3a. The main wiring portions 4Aa, 4Ab, 4Ac, 4Ad, and 4Ae are electrically connected in series to the plurality of auxiliary wiring portions 4B so that the current flows in the same direction at the time of supplying power to the excitation wiring 4. The main wiring portions 4Aa, 4Ab, 4Ac, 4Ad, and 4Ae are formed from the same conducting material, and individually form a part of the excitation wiring 4.

The main wiring portions 4Aa, 4Ab, 4Ac, 4Ad, and 4Ae are hereinafter collectively referred to as "plurality of main wiring portions 4A". Unless otherwise specified, the configuration described as a feature of the plurality of main wiring portions 4A is equipped in the respective main wiring portions 4Aa, 4Ab, 4Ac, 4Ad, and 4Ae.

It is preferred that the plurality of main wiring portions 4A is arranged symmetrically with respect to the crossing line CL between the plane (yz-plane) passing the center in the width direction of the magnetosensitive portion 3a at a certain depth and the plane (xy-plane) corresponding to the certain depth (hereinafter referred to as "widthwise center line"). Specifically, in a case of the main wiring portions 4A illustrated in FIG. 1, the main wiring portion 4Ac is provided at a position overlapping the widthwise center line CL as viewed in plan view. It is preferred that the main wiring portion 4Ab and the main wiring portion 4Ad are arranged at the same distance from the main wiring portion 4Ac, and that the main wiring portion 4Aa and the main wiring portion 4Ae are arranged at the same distance from the main wiring portion 4Ac.

It is preferred to arrange the plurality of main wiring portions 4A so that adjacent pairs of the main wiring portions have the same interval. The following case is considered in which the magnetosensitive portion 3a is equally divided into, for example, six regions in the width direction, and the six divided regions of the magnetosensitive portion 3a are defined as a first region, a second region, a third region, a fourth region, a fifth region, and a sixth region in order from the smallest to the largest of "x" (from the left to the right). In this case, preferred arrangement is such that the center in the width direction of the main wiring portion 4Aa overlaps the first region as viewed in plan; the center in the width direction of the main wiring portion 4Ab overlaps the second region; the main wiring portion 4Ac is provided across the third region and the fourth region; the center in the width direction of the main wiring portion 4Ad overlaps the fifth region; and the center in the width direction of the main wiring portion 4Ae overlaps the sixth region.

The distance of each of the plurality of main wiring portions 4A from the surface S of the semiconductor substrate 2 may be appropriately set from the viewpoint of applying a uniform calibration magnetic field to the magnetosensitive portion 3a throughout the width direction. It is preferred to arrange the plurality of main wiring portions 4A at the same distance from the surface S of the semiconductor substrate 2.

The width of each of the plurality of main wiring portions 4A may be appropriately set in consideration of the distance from the surface of the magnetosensitive portion 3a and the width of the magnetosensitive portion 3a from the viewpoint of applying a uniform calibration magnetic field to the magnetosensitive portion 3a throughout the width direction. For example, in the semiconductor device 1A of FIG. 1, the total sum of the widths of the plurality of main wiring portions 4A is set to substantially half the width of the magnetosensitive portion 3a.

Further, it is preferred that the total sum of the widths of the plurality of main wiring portions 4A is equal to or more than ½ of the width of the magnetosensitive portion 3a. By thus setting the total sum of the widths of the plurality of main wiring portions 4A equal to or more than ½ of the width of the magnetosensitive portion 3a, a uniform calibration magnetic field can be applied to the magnetosensitive portion 3a throughout the width direction irrespective of the distance from the surface of the magnetosensitive portion 3a.

The plurality of auxiliary wiring portions 4B corresponds to portions of the excitation wiring 4 that are arranged in the non-overlapping region. That is, the plurality of auxiliary wiring portions 4B corresponds to portions of the excitation wiring 4 other than the plurality of main wiring portions 4A.

The plurality of auxiliary wiring portions 4B includes auxiliary wiring portions 4Ba, 4Bb, 4Bc, and 4Bd in this order starting from the end portion E1 side of the excitation wiring 4. The auxiliary wiring portion 4Ba is connected to the main wiring portion 4Aa and the main wiring portion 4Ab. The auxiliary wiring portion 4Bb is connected to the main wiring portion 4Ab and the main wiring portion 4Ac. The auxiliary wiring portion 4Bc is connected to the main wiring portion 4Ac and the main wiring portion 4Ad. The auxiliary wiring portion 4Bd is connected to the main wiring portion 4Ad and the main wiring portion 4Ae.

All the auxiliary wiring portions 4Ba, 4Bb, 4Bc, and 4Bd are formed from the same conducting material as the main wiring portions 4Aa, 4Ab, 4Ac, 4Ad, and 4Ae, and form the single excitation wiring 4 together with the main wiring portions 4Aa, 4Ab, 4Ac, 4Ad, and 4Ae. The excitation wiring 4 constituted from the main wiring portions 4Aa, 4Ab, 4Ac, 4Ad, and 4Ae and the auxiliary wiring portions 4Ba, 4Bb, 4Bc, and 4Bd is provided in the form with a plurality of turns as viewed in plan view.

The auxiliary wiring portions 4Ba, 4Bb, 4Bc, and 4Bd are hereinafter collectively referred to as "plurality of auxiliary wiring portions 4B". Unless otherwise specified, the configuration described as a feature of the plurality of auxiliary wiring portions 4B is equipped in the respective auxiliary wiring portions 4Ba, 4Bb, 4Bc, and 4Bd.

The plurality of auxiliary wiring portions 4B has portions parallel to the plurality of main wiring portions 4A as viewed in plan view.

Of the auxiliary wiring portion 4Ba, a portion parallel to the plurality of main wiring portions 4A is a parallel auxiliary wiring portion 4Bap. Of the auxiliary wiring portion 4Bb, a portion parallel to the plurality of main wiring portions 4A is a parallel auxiliary wiring portion 4Bbp. Of the auxiliary wiring portion 4Bc, a portion parallel to the plurality of main wiring portions 4A is a parallel auxiliary wiring portion 4Bcp. Of the auxiliary wiring portion 4Bd, a portion parallel to the plurality of main wiring portions 4A is a parallel auxiliary wiring portion 4Bdp.

The parallel auxiliary wiring portions 4Bap, 4Bbp, 4Bcp, and 4Bdp are hereinafter collectively referred to as "plurality of parallel auxiliary wiring portions 4Bp". Unless otherwise specified, the configuration described as a feature of the plurality of parallel auxiliary wiring portions 4Bp is equipped in the respective parallel auxiliary wiring portions 4Bap, 4Bbp, 4Bcp, and 4Bdp.

The plurality of parallel auxiliary wiring portions 4Bp is arranged to have a current flowing in an opposite direction to that in the plurality of main wiring portions 4A at the time of supplying power to the excitation wiring 4. The direction of the calibration magnetic field excited around the excitation wiring 4 depends on the direction of the current flowing through the excitation wiring 4. The direction of the calibration magnetic field generated by the plurality of main wiring portions 4A is opposite to that of the calibration magnetic field generated by the plurality of parallel auxiliary wiring portions 4Bp. It is preferred that in the semiconductor device 1A, only the calibration magnetic field generated by the plurality of main wiring portions 4A is applied to the magnetosensitive portion 3a. Thus, it is preferred to arrange the plurality of parallel auxiliary wiring portions 4Bp with a larger distance from the plurality of main wiring portions 4A as viewed in plan view. Specifically, the shortest distance D among the distances between the plurality of main wiring portions 4A and the plurality of parallel auxiliary wiring portions is preferably 15 µm or more, more preferably 45 µm or more. In FIG. 1, the main wiring portion 4Aa and the parallel auxiliary wiring portion 4Bap form the closest pair among the distances between the plurality of main wiring portions 4A and the plurality of parallel auxiliary wiring portions 4Bp, and the distance D defines the distance between the main wiring portion 4Aa and the parallel auxiliary wiring portion 4Bap.

It is preferred that the plurality of parallel auxiliary wiring portions 4Bp is arranged to have a small dimension as viewed in plan view. For example, the following arrangement is preferred: the main wiring portion 4Aa and the auxiliary wiring portion 4Ba, the main wiring portion 4Ab and the auxiliary wiring portion 4Bb, the main wiring portion 4Ac and the auxiliary wiring portion 4Bc, and the main wiring portion 4Ad and the auxiliary wiring portion 4Bd are each arranged to partially form concentric rectangles of different sizes, permitting reduction in dimension of the parallel auxiliary wiring portions 4Bap, 4Bbp, 4Bcp, and 4Bdp.

The shape of each of the plurality of auxiliary wiring portions 4B may be the same as or different from that of the plurality of main wiring portions 4A. The plurality of auxiliary wiring portions 4B can be arranged at freely set intervals. For example, the plurality of auxiliary wiring portions 4B may be provided to be parallel to or cross one another as viewed in plan view.

Of the excitation wiring 4, a region between the end portion E1 and the main wiring portion 4Aa and a region between the end portion E2 and the main wiring portion 4Ae are included in the auxiliary wiring portions 4B. It is preferred that the region between the end portion E1 and the main wiring portion 4Aa and the region between the end portion E2 and the main wiring portion 4Ae are arranged not to have a current flowing in an opposite direction to that in the plurality of main wiring portions 4A at the time of supplying current.

In the semiconductor device 1A of the above-mentioned configuration, by the constant current flowing through the excitation wiring 4, the calibration magnetic field excited around the excitation wiring 4 is applied to the magnetosensitive portion 3a. The calibration magnetic field is excited around the main wiring portions 4Aa, 4Ab, 4Ac, 4Ad, and 4Ae. Further, the magnetic field is also excited around the auxiliary wiring portions 4Ba, 4Bb, 4Bc, and 4Bd, the region between the end portion E1 and the main wiring portion 4Aa, and the region between the end portion E2 and the main wiring portion 4Ae.

The ellipse denoted by reference symbol B and indicated by the dashed line in FIG. 2 schematically represents a composite magnetic field of the calibration magnetic fields generated around the plurality of main wiring portions 4A. Further, the ellipse denoted by reference symbol B1 and indicated by the dashed line in FIG. 2 schematically represents the calibration magnetic field generated by the main wiring portion 4Ae.

The plurality of main wiring portions 4A is electrically connected in series. Thus, when each of the plurality of main wiring portions 4A has the same configuration, the calibration magnetic fields generated by the main wiring portions 4Aa, 4Ab, 4Ac, 4Ad, and 4Ae have the same direction and the same intensity distribution. Of the calibration magnetic field B1 generated by the main wiring portion 4Ae, a magnetic field generated closer to the magnetosensitive portion 3a side than to the main wiring portion 4Ae decreases the intensity in the width direction of the magnetosensitive portion 3a as the distance from the main wiring portion 4Ae in the width direction of the magnetosensitive portion 3a increases.

Since the calibration magnetic field B is a composite magnetic field of the magnetic fields generated by the plurality of main wiring portions 4A in the semiconductor device 1A, the calibration magnetic field of uniform intensity can be applied to the magnetosensitive portion 3a throughout the width direction.

Further, since the plurality of main wiring portions 4A is a part of the single wiring, the same amount of current flows through the main wiring portions 4Aa, 4Ab, 4Ac, 4Ad, and 4Ae, to apply a composite magnetic field to the magnetosensitive portion 3a. Accordingly, under a state in which the same amount of current flows, a calibration magnetic field of higher intensity can be applied when compared to the case where the plurality of main wiring portions 4A is not constituted from the single wiring. In other words, a calibration magnetic field of the same intensity can be applied with a smaller amount of current.

In a case in which a plurality of independent wirings is arranged for use as the excitation wiring, it is required to supply a current to each of the wirings, with the result that the total amount of supplied current increases depending on the number of wirings. In contrast, in a case in which the excitation wiring 4 including the plurality of main wiring portions 4A is used as the excitation wiring, a current supplied to the excitation wiring 4 flows through all the main wiring portions 4A since the excitation wiring 4 is the single wiring. Consequently, even in a case in which the number of main wiring portions 4A in the excitation wiring 4 increases, the amount of current supplied to the excitation wiring 4 does not change.

As described above, the semiconductor device 1A can apply a calibration magnetic field of high intensity to the magnetosensitive portion 3a even in a case in which only a limited amount of current is available.

Further, in the semiconductor device 1A, since the plurality of main wiring portions 4A is arranged in the overlapping region as viewed in plan view, variation in intensity of the calibration magnetic field applied to the magnetosensitive portion 3a can be suppressed.

Further, in the semiconductor device 1A, since the excitation wiring 4 is formed as the single wiring including the plurality of main wiring portions 4A and the plurality of auxiliary wiring portions 4B, the same magnetic field intensity can be obtained with a smaller amount of power supplied to the excitation wiring 4 compared with the configuration in which a plurality of independent excitation wirings corresponding to the main wiring portions 4A is provided.

Second Embodiment

Figure 3:
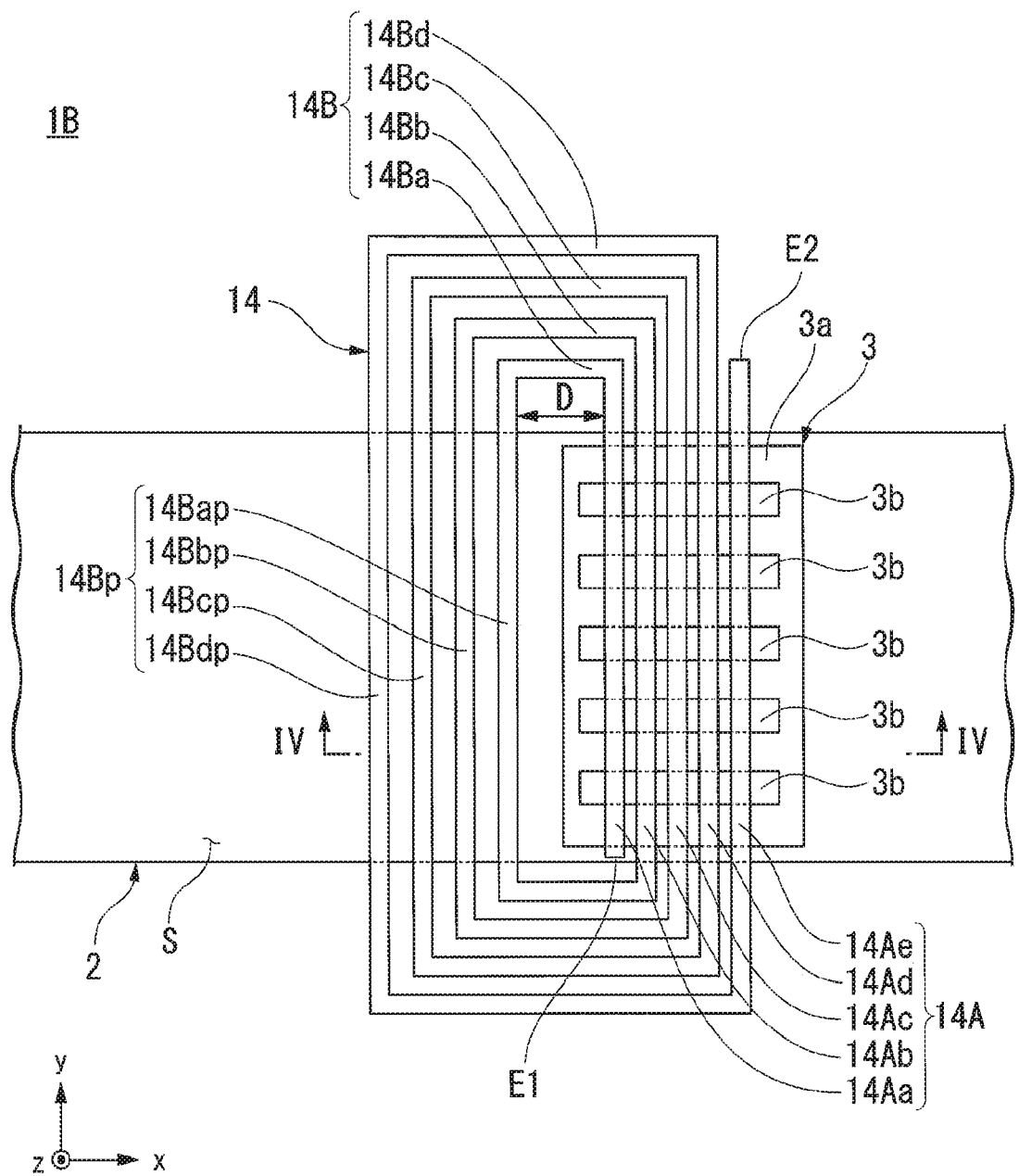
FIG. 3 is a plan view for illustrating a configuration of a semiconductor device according to the second embodiment of the present invention.
Figure 4:
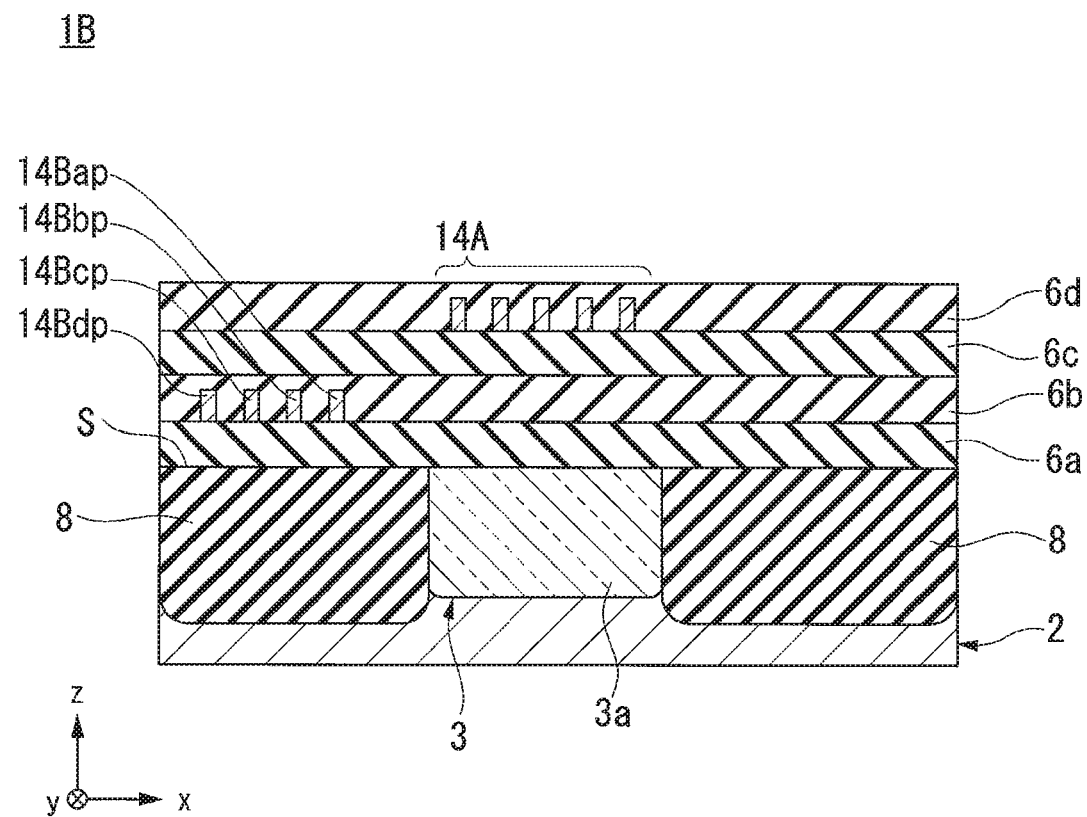
FIG. 4 is a sectional view taken along the line IV-IV of the semiconductor device according to the second embodiment.

FIG. 3 is a plan view for illustrating a configuration of a semiconductor device 1B according to the second embodiment of the present invention. FIG. 4 is a sectional view of the semiconductor device 1B taken along the line IV-IV of FIG. 3 (IV-IV sectional view). In FIG. 3, insulating layers 6a to 6d to be described later are omitted for ease of description.

The semiconductor device 1B differs from the semiconductor device 1A in that an excitation wiring 14 is provided in place of the excitation wiring 4, but other components are substantially the same as those of the semiconductor device 1A. In the following description, equivalent components to those of the semiconductor device 1A are denoted by identical reference symbols, and duplicate description thereof is omitted.

The semiconductor device 1B includes the semiconductor substrate 2, the vertical Hall element 3, and the excitation wiring 14 formed of a single wiring with a plurality of turns.

The excitation wiring 14 includes a plurality of main wiring portions 14A arranged in the overlapping region and a plurality of auxiliary wiring portions 14B arranged in the non-overlapping region. The main wiring portions 14A correspond to the main wiring portions 4A, and the auxiliary wiring portions 14B correspond to the auxiliary wiring portions 4B in view of a correspondence to the excitation wiring 4 of the semiconductor device 1A.

The excitation wiring 14 differs from the excitation wiring 4 in the arrangement of the plurality of auxiliary wiring portions 14B. To describe the difference specifically, portions of the plurality of auxiliary wiring portions 14B parallel to the plurality of main wiring portions 14A, that is, parallel auxiliary wiring portions 14Bap, 14Bbp, 14Bcp, and 14Bdp to be described later are arranged on the insulating layer 6b which is different from the insulating layer 6d on which the plurality of main wiring is arranged. The excitation wiring 14 is the same as the excitation wiring 4 except the arrangement of the plurality of auxiliary wiring portions 14B.

Main wiring portions 14Aa, 14Ab, 14Ac, 14Ad, and 14Ae are hereinafter collectively referred to as "plurality of main wiring portions 14A". Further, auxiliary wiring portions 14Ba, 14Bb, 14Bc, and 14Bd are hereinafter collectively referred to as "plurality of auxiliary wiring portions 14B".

Of the auxiliary wiring portion 14Ba, a portion parallel to the plurality of main wiring portions 14A is a parallel auxiliary wiring portion 14Bap. Of the auxiliary wiring portion 14Bb, a portion parallel to the plurality of main wiring portions 14A is a parallel auxiliary wiring portion 14Bbp. Of the auxiliary wiring portion 14Bc, a portion parallel to the plurality of main wiring portions 14A is a parallel auxiliary wiring portion 14Bcp. Of the auxiliary wiring portion 14Bd, a portion parallel to the plurality of main wiring portions 14A is a parallel auxiliary wiring portion 14Bdp.

In the semiconductor device 1B, at least a part of the plurality of auxiliary wiring portions 14B is arranged closer to the surface S of the semiconductor substrate 2 compared with the plurality of main wiring portions 14A.

As illustrated in FIG. 4, the plurality of parallel auxiliary wiring portions 14Bp is arranged closer to the surface S of the semiconductor substrate 2 than the plurality of main wiring portions 14A. Preferably all the plurality of parallel auxiliary wiring portion 14Bp is arranged closer to the surface S of the semiconductor substrate 2 than the plurality of main wiring portions 14A. More preferably all the plurality of auxiliary wiring portion 14B is arranged closer to the surface S of the semiconductor substrate 2 than the plurality of main wiring portions 14A.

On the surface S of the semiconductor substrate 2, the insulating layers 6a to 6d are laminated. In the semiconductor device 1B illustrated in FIG. 4, the insulating layer 6a is formed to cover the surface S of the semiconductor substrate 2. The parallel auxiliary wiring portions 14Bp are provided on the insulating layer 6a. The insulating layer 6b is formed on the insulating layer 6a to cover the parallel auxiliary wiring portions 14Bp. The insulating layer 6c is formed on the insulating layer 6b. The plurality of main wiring portions 14A is provided on the insulating layer 6c. The insulating layer 6d is formed on the insulating layer 6c to cover the plurality of main wiring portions 14A.

The configuration in which at least a part of the plurality of auxiliary wiring portions 14B is arranged closer to the surface S of the semiconductor substrate 2 than the plurality of main wiring portions 14A can be achieved by applying, for example, a configuration in which the different auxiliary wiring portions 14B are connected together by a through-electrode that passes through the insulating layer 6b and the insulating layer 6c.

The intensity of the calibration magnetic field applied to the magnetosensitive portion 3a can be made higher in the semiconductor device 1B than in the semiconductor device 1A.

In the semiconductor device 1B, at least a part of the plurality of auxiliary wiring portions 14B is arranged closer to the surface S of the semiconductor substrate 2 than the plurality of main wiring portions 14A, and hence in the magnetic field generated by the plurality of auxiliary wiring 14B applied to the magnetosensitive portion 3a, the ratio of the magnetic field component perpendicular to the surface S of the substrate 2 increases. The component in the width direction of the magnetosensitive portion 3a, of the magnetic field applied to the magnetosensitive portion 3a can be thereby reduced. Of the magnetic field applied to the magnetosensitive portion 3a, magnetic fields other than calibration magnetic fields generated by the plurality of main wiring portions 14A can be accordingly reduced, to thereby improve the efficiency of the application of the calibration magnetic field to the magnetosensitive portion 3a. That is, the accuracy in estimating the actual sensitivity of the vertical Hall element 3 is improved.

Third Embodiment

Figure 5:
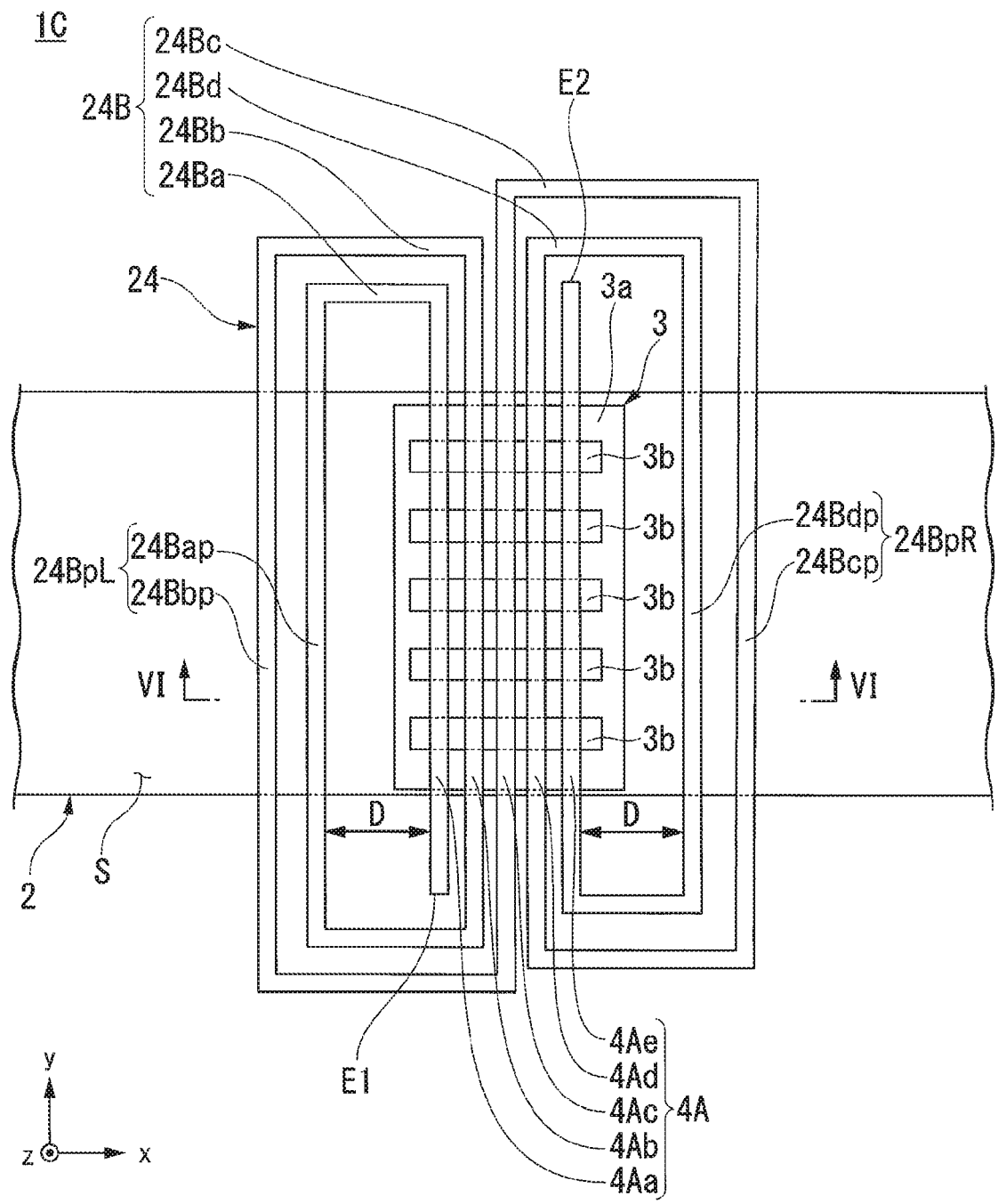
FIG. 5 is a plan view for illustrating a configuration of a semiconductor device according to the third embodiment of the present invention.
Figure 6:
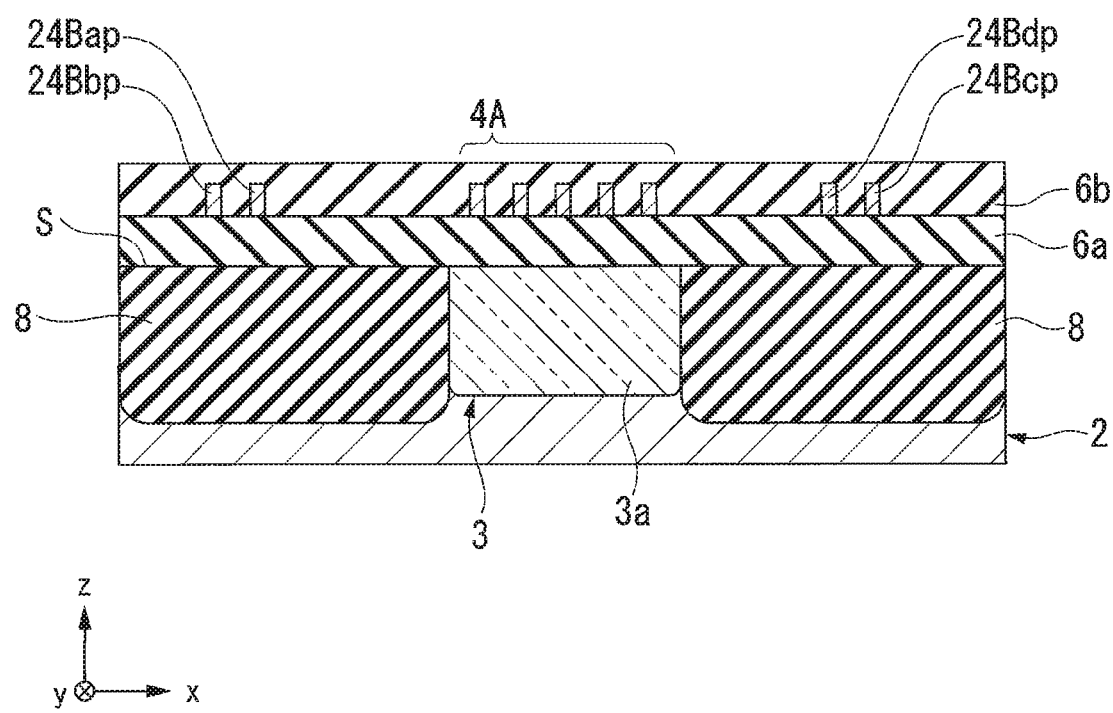
FIG. 6 is a sectional view taken along the line VI-VI of the semiconductor device according to the third embodiment.

FIG. 5 is a plan view for illustrating a configuration of a semiconductor device 1C according to the third embodiment of the present invention. FIG. 6 is a sectional view of the semiconductor device 1C taken along the line VI-VI of FIG. 5 (VI-VI sectional view). In FIG. 5, the insulating layers 6a and 6b are omitted for ease of description.

The semiconductor device 1C differs from the semiconductor device 1A in that an excitation wiring 24 is provided in place of the excitation wiring 4, but other components thereof are substantially the same as those of the semiconductor device 1A. In the following description, equivalent components to those of the semiconductor device 1A are denoted by identical reference symbols, and duplicate description thereof is omitted.

The semiconductor device 1C includes the semiconductor substrate 2, the vertical Hall element 3, and the excitation wiring 24 formed of a single wiring with a plurality of turns. The excitation wiring 24 includes the plurality of main wiring portions 4A arranged on a surface of the insulating layer 6b in the overlapping region, and a plurality of auxiliary wiring portions 24B arranged similarly on the surface of the insulating layer 6b in the non-overlapping region. Similar to the excitation wiring 4, the excitation wiring 24 forms a single wiring. The excitation wiring 24 differs from the excitation wiring 4 in that the plurality of auxiliary wiring portions 24B is provided in place of the plurality of auxiliary wiring portions 4B.

The plurality of auxiliary wiring portions 24B includes parallel auxiliary wiring portions 24BpL and 24BpR that are parallel to the plurality of main wiring portions 4A. The parallel auxiliary wiring portions 24BpL include parallel auxiliary wiring portions 24Bap and 24Bbp, and are arranged on the left side of the widthwise center line CL (not shown in FIG. 5). The parallel auxiliary wiring portions 24BpR include parallel auxiliary wiring portions 24Bcp and 24Bdp, and are arranged on the right side of the widthwise center line CL. Auxiliary wiring portions 24Ba, 24Bb, 24Bc, and 24Bd are arranged in this order starting from the end portion E1 side of the excitation wiring 24.

The plurality of auxiliary wiring portions 24B of the excitation wiring 24 corresponds to the auxiliary wiring portions 4B in view of a correspondence to the excitation wiring 4. The difference between the auxiliary wiring portions 24B and the auxiliary wiring portions 4B is that the parallel auxiliary wiring portions 24Bap and 24Bbp and the parallel auxiliary wiring portions 24Bcp and 24Bdp are arranged to sandwich the plurality of main wiring portions 4A from the both sides as viewed in plan view. A portion of the auxiliary wiring portion 24Ba parallel to the plurality of main wiring portions 4A is herein referred to as "parallel auxiliary wiring portion 24Bap". Likewise, portions of the auxiliary wiring portions 24Bb, 24Bc, and 24Bd parallel to the plurality of main wiring portions 4A are referred to as "parallel auxiliary wiring portion 24Bbp", "parallel auxiliary wiring portion 24Bcp", and "parallel auxiliary wiring portion 24Bdp", respectively. The excitation wiring 24 is the same as the excitation wiring 4 except the arrangement of the parallel auxiliary wiring portions 24Bap, 24Bbp, 24Bcp, and 24Bdp. The auxiliary wiring portions 24Ba, 24Bb, 24Bc, and 24Bd are hereinafter collectively referred to as "plurality of auxiliary wiring portions 24B".

In the semiconductor device 1C, the current flows through the parallel auxiliary wiring portions 24BpR and 24BpL in the opposite direction to that in the plurality of main wiring portions 4A. Further, both of the shortest distance between the plurality of main wiring portions 4A and the parallel auxiliary wiring portions 24BpL and that between the plurality of main wiring portions 4A and the parallel auxiliary wiring portions 24BpR are the distance D. In FIG. 5, the main wiring portion 4Aa and the parallel auxiliary wiring portion 24Bap form the closest pair of the plurality of main wiring portions 4A and the parallel auxiliary wiring portions 24BpL. Further, the main wiring portion 4Ae and the parallel auxiliary wiring portion 24Bdp form the closest pair of the plurality of main wiring portions 4A and the parallel auxiliary wiring portions 24BpR.

In the semiconductor device 1C, the intensity of the calibration magnetic field applied to the magnetosensitive portion 3a can be increased similarly to the semiconductor device 1A, and the calibration magnetic field can have more uniform intensity since the plurality of auxiliary wirings is arranged symmetrically regarding the magnetosensitive portion 3a in the non-overlapping region.

In the semiconductor device 1C, since the parallel auxiliary wiring portions 24BpR and 24BpL are arranged to sandwich the magnetosensitive portion 3a as viewed in plan view, the magnetic fields generated by the plurality of auxiliary wiring portions 24B are applied more uniformly in the width direction of the magnetosensitive portion 3a than in the semiconductor device 1A. Accordingly, in the magnetic field applied to the magnetosensitive portion 3a, the influence of magnetic fields other than the calibration magnetic field generated by the plurality of main wiring portions 4A can be equalized in the width direction of the magnetosensitive portion 3a. The accuracy of estimating an actual sensitivity of the vertical Hall element 3 can thus be improved.

Further, in the semiconductor device 1C the parallel auxiliary wiring portions 24BpR and 24BpL are arranged to sandwich the magnetosensitive portion 3a. That is, the plurality of auxiliary wiring portions 24B is arranged to disperse. Accordingly, peripheral circuits can be less affected by the heat generated in the plurality of auxiliary wiring portions 24B.

In the above-mentioned semiconductor device 1C, the parallel auxiliary wiring portions 24BpR and 24BpL include the same number of parallel auxiliary wiring portions, but the number is not limited to this example. For example, the parallel auxiliary wiring portions 24BpR may include a larger number of parallel auxiliary wiring portions, or the parallel auxiliary wiring portions 24BpL may include a larger number of parallel auxiliary wiring portions. Further, in the above-mentioned semiconductor device 1C, the shortest distance between the plurality of main wiring portions 4A and the parallel auxiliary wiring portions 24BpL is the same as that between the plurality of main wiring portions 4A and the parallel auxiliary wiring portions 24BpR, but the distances may be different.

Fourth Embodiment

Figure 7:
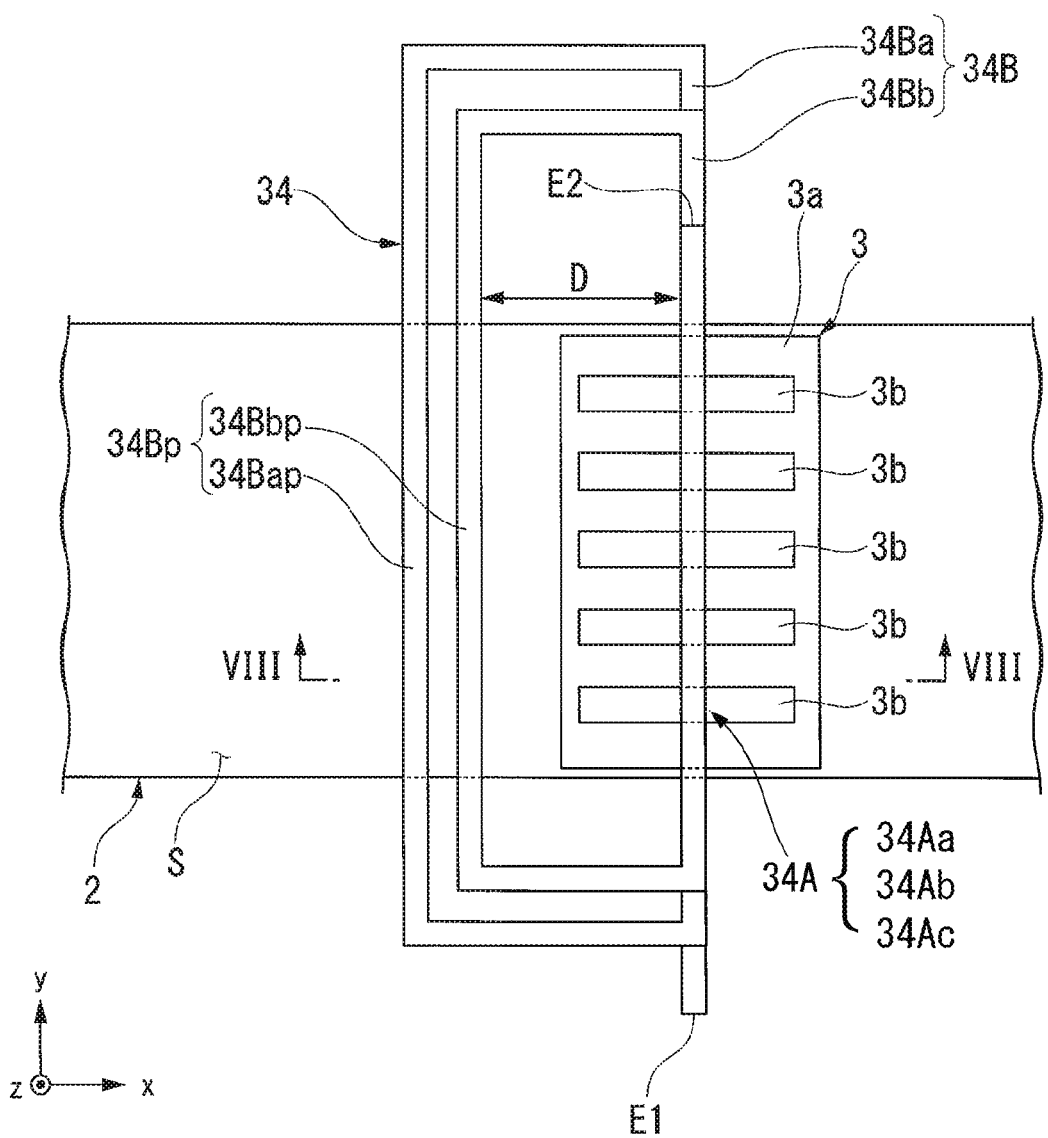
FIG. 7 is a plan view for illustrating a configuration of a semiconductor device according to the fourth embodiment of the present invention.
Figure 8:
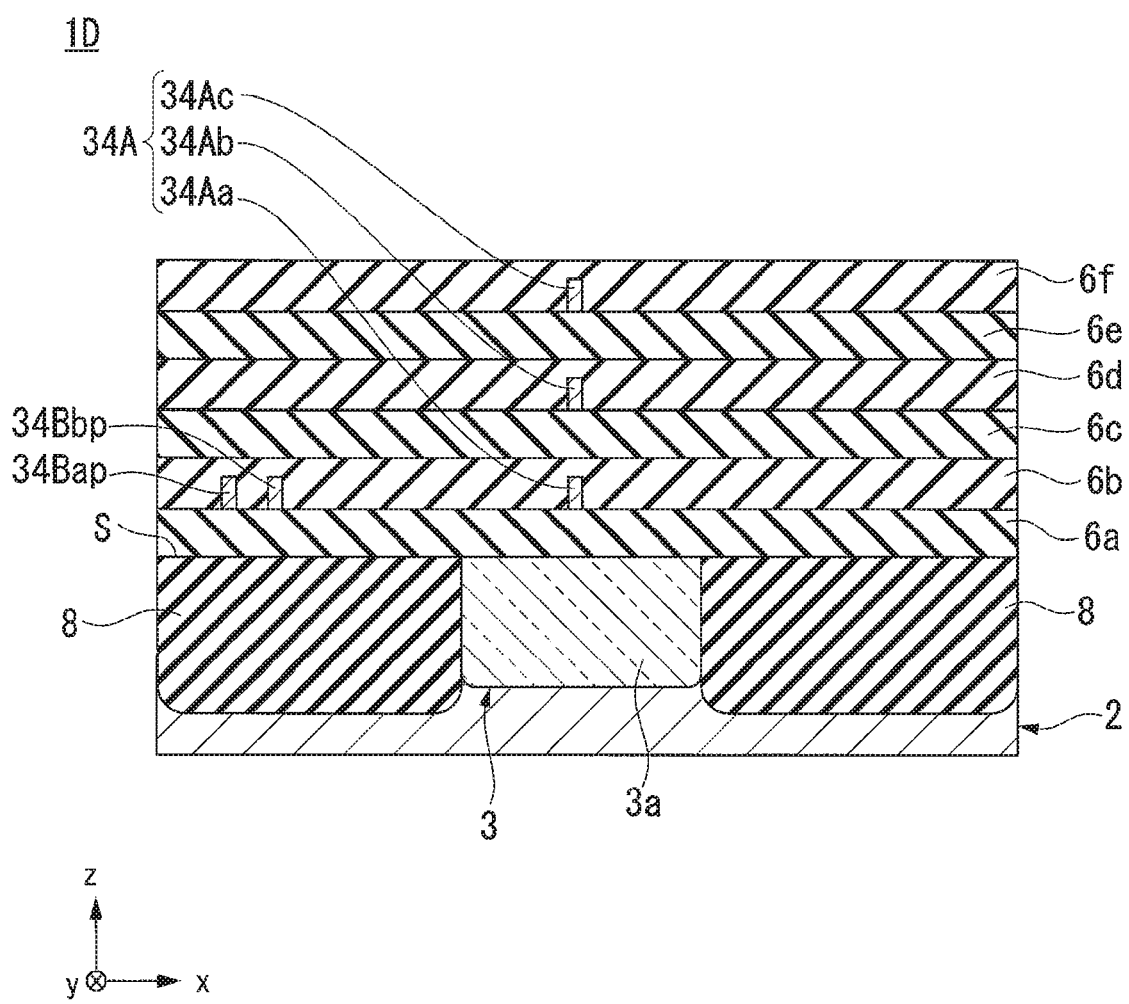
FIG. 8 is a sectional view taken along the line VIII-VIII of the semiconductor device according to the fourth embodiment.

FIG. 7 is a plan view for illustrating a configuration of a semiconductor device 1D according to the fourth embodiment of the present invention. FIG. 8 is a sectional view of the semiconductor device 1D taken along the line VIII-VIII of FIG. 7 (VIII-VIII sectional view). In FIG. 7, insulating layers 6a to 6f to be described later are omitted for ease of description.

The semiconductor device 1D differs from the semiconductor device 1A in that an excitation wiring 34 is provided in place of the excitation wiring 4, but other components are substantially the same as those of the semiconductor device 1A. In the following description, equivalent components to those of the semiconductor device 1A are denoted by identical reference symbols, and duplicate description thereof is omitted.

The semiconductor device 1D includes the semiconductor substrate 2, the vertical Hall element 3, and the excitation wiring 34 formed of a single wiring with a plurality of turns. Similar to the excitation wiring 4, the excitation wiring 34 includes a plurality of main wiring portions 34A arranged in the overlapping region and a plurality of auxiliary wiring portions 34B arranged in the non-overlapping region. The main wiring portions 34A correspond to the main wiring portions 4A, and the auxiliary wiring portions 34B correspond to the auxiliary wiring portions 4B in view of a correspondence to the excitation wiring 4.

The excitation wiring 34 differs from the excitation wiring 4 in the arrangement of the plurality of main wiring portions 34A: main wiring portions 34Aa,34Ab, and 34Ac to be described later are each arranged on the surface of the different insulating layer and are arranged along the direction perpendicular to the surface S of the semiconductor substrate 2. Since the arrangement of the plurality of main wiring portions 34A is different from that of the plurality of main wiring portions 4A, the arrangement of the plurality od auxiliary wiring portions is different.

The plurality of auxiliary wiring portions 34B has portions parallel to the plurality of main wiring portions 34A as viewed in plan view. Of the plurality of auxiliary wiring portions 34B parallel to the plurality of main wiring portions 34A is the plurality of parallel auxiliary wiring portions 34Bp, that is, parallel auxiliary wiring portions 34Bap and 34Bbp.

Main wiring portions 34Aa, 34Ab, and 34Ac are hereinafter collectively referred to as "plurality of main wiring portions 34A". All the main wiring portions of the plurality of main wiring portions 34A are arranged in a direction orthogonal to the surface S of the semiconductor substrate.

The plurality of auxiliary wiring portions 34B includes auxiliary wiring portions 34Ba and 34Bb arranged in this order starting from the end portion E1 side of the excitation wiring 34. The auxiliary wiring portions 34Ba and 34Bb are hereinafter collectively referred to as "plurality of auxiliary wiring portions 34B".

On the surface S of the semiconductor substrate 2, the insulating layers 6a to 6f are laminated. In the semiconductor device 1D illustrated in FIG. 8, the insulating layer 6a is formed to cover the surface S of the semiconductor substrate 2. The parallel auxiliary wiring portions 34Bap and 34Bbp and the main wiring portion 34Aa are provided on the insulating layer 6a. The insulating layer 6b is formed on the insulating layer 6a to cover the parallel auxiliary wiring portions 34Bap and 34Bbp and the main wiring portion 34Aa. The insulating layer 6c is formed on the insulating layer 6b. The main wiring portion 34Ab is provided on the insulating layer 6c. The insulating layer 6d is formed on the insulating layer 6c to cover the main wiring portion 34Ab. The insulating layer 6e is formed on the insulating layer 6d. The main wiring portion 34Ac is provided on the insulating layer 6e. The insulating layer 6f is formed to cover the main wiring portion 34Ac.

The configuration in which all the main wiring portions of the plurality of main wiring portions 34A is arranged in the direction orthogonal to the surface S of the semiconductor substrate 2 may be achieved by applying, for example, the configuration in which the auxiliary wiring portions are connected together by a through-electrode that passes the insulating layer.

In the semiconductor device 1D, since each of the main wiring portions 34Aa, 34Ab and 34Ac is provided on the different insulating layers 6b, 6d, and 6f, respectively, the main wiring portions 34Aa, 34Ab and 34Ac can be made wider along the width direction than the main wiring portions 4Aa to 4Ae of the semiconductor device 1A explained above. The intensity of the calibration magnetic field applied to the magnetosensitive portion 3a can be increased no less than or higher than that of the semiconductor device 1A.

In the semiconductor device 1D, since the main wiring portions 34Aa, 34Ab and 34Ac are made wider, the resistance thereof relatively reduces and the amount of generated heat decreases. Hence the deviation of characteristics caused by the heat can be relaxed in the semiconductor device 1D having above-mentioned features. Additionally, in a case where the plurality of auxiliary wiring portions 34B can also be made wider, a larger current flowing through the plurality of main wiring portions 34A and the plurality of auxiliary wiring portions 34B can be obtained.

In the above-mentioned semiconductor device 1D, the plurality of main wiring portions 34A is arranged to overlap one another as viewed in plan view. However, configuration of the semiconductor device 1D is not limited to this example, and the positions of the plurality of main wiring portions 34A may not overlap one another as viewed in plan view.

Fifth Embodiment

Figure 9:
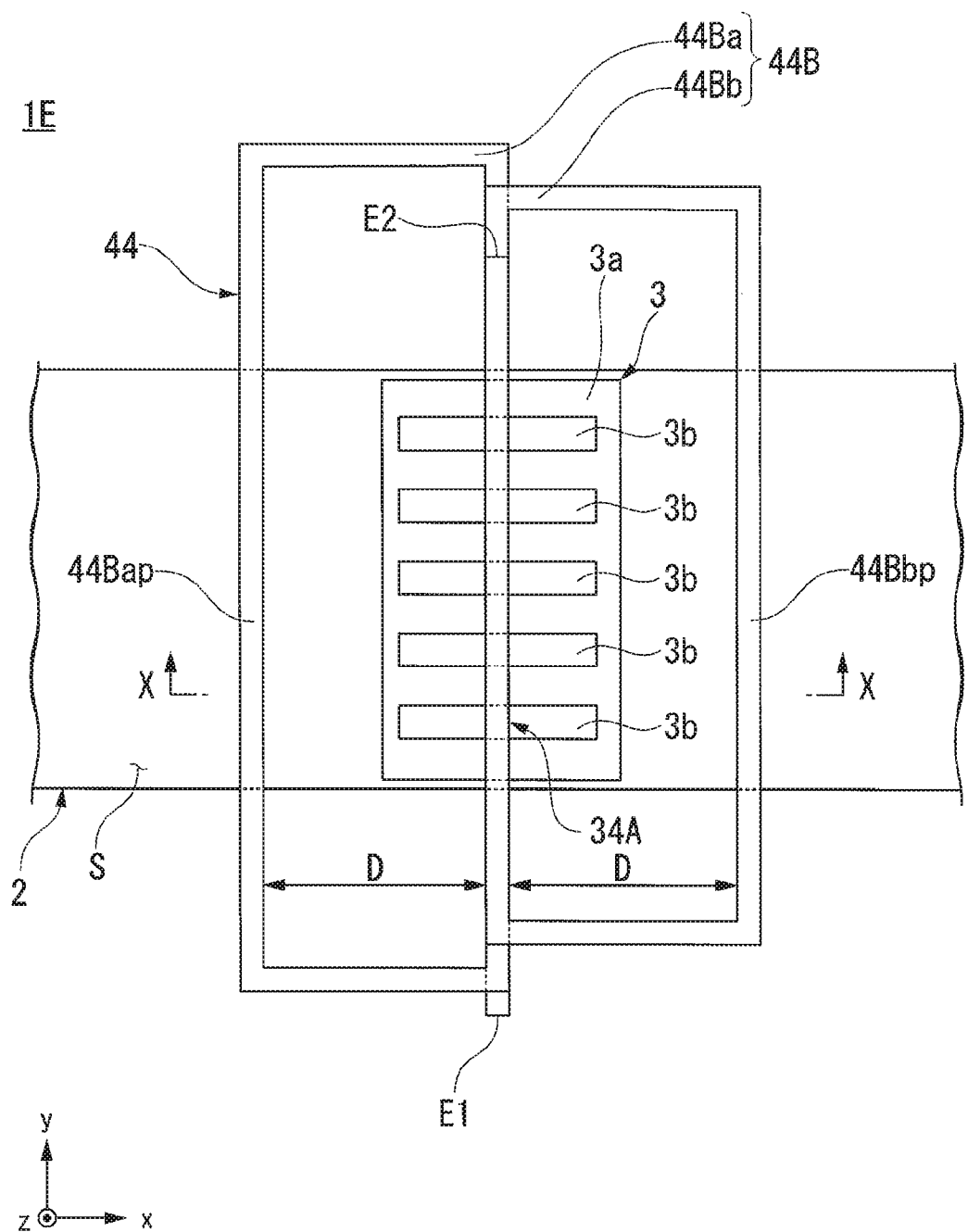
FIG. 9 is a plan view for illustrating a configuration of a semiconductor device according to the fifth embodiment of the present invention.
Figure 10:
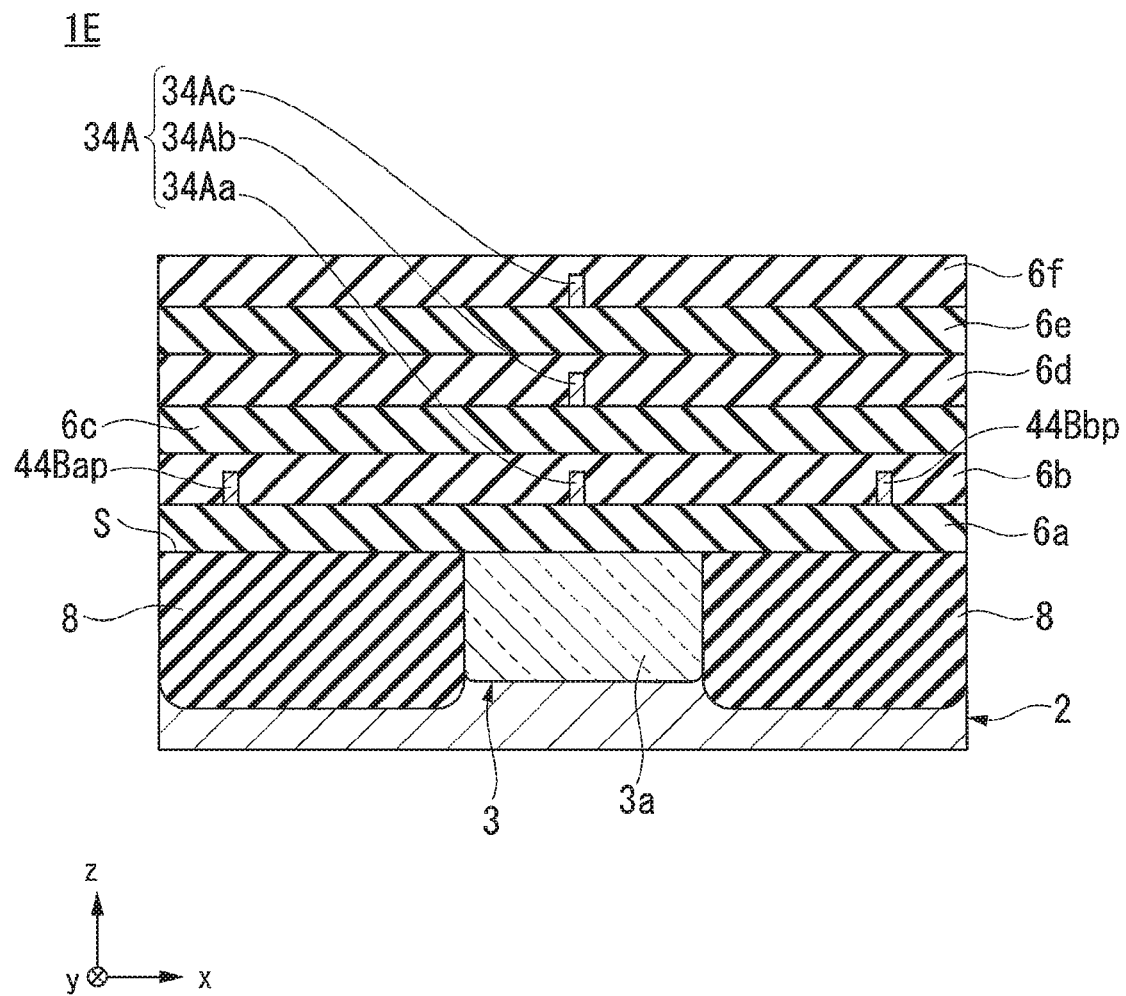
FIG. 10 is a sectional view taken along the line X-X of the semiconductor device according to the fifth embodiment.

FIG. 9 is a plan view for illustrating a configuration of a semiconductor device 1E according to the fifth embodiment of the present invention. FIG. 10 is a sectional view of the semiconductor device 1E taken along the line X-X of FIG. 9 (X-X sectional view). In FIG. 9, similarly to FIG. 7, the insulating layers 6a to 6f are omitted for ease of description.

The semiconductor device 1E differs from the semiconductor device 1D in that an excitation wiring 44 is provided in place of the excitation wiring 4, but other components thereof are substantially the same as those of the semiconductor device 1A. In the following description, equivalent components to those of the semiconductor device 1D are denoted by identical reference symbols, and duplicate description thereof is omitted.

The semiconductor device 1E includes the semiconductor substrate 2, the vertical Hall element 3, and an excitation wiring 44 formed of a single wiring with a plurality of turns. The excitation wiring 44 includes the plurality of main wiring portions 34A arranged in the overlapping region, and a plurality of auxiliary wiring portions 44B arranged in the non-overlapping region. The excitation wiring 44 forms a single wiring as same as the excitation wiring 23. The excitation wiring 44 differs from the excitation wiring 34 in that the plurality of auxiliary wiring portions 44B is provided in place of the plurality of auxiliary wiring portions 34B.

The plurality of auxiliary wiring portions 44B includes a plurality of parallel auxiliary wiring portions 44Bap and 44Bbp that are parallel to the plurality of main wiring portions 34A. The parallel auxiliary wiring portions 44Bap is arranged on the left side of the widthwise center line CL (not shown in FIG. 9). The parallel auxiliary wiring portions 44Bbp is arranged on the right side of the widthwise center line CL. Auxiliary wiring portions 44Ba and 44Bb are arranged in this order starting from the end portion E1 side of the excitation wiring 44.

The plurality of auxiliary wiring portions 44B of the excitation wiring 44 corresponds to the auxiliary wiring portions 34B in view of a correspondence to the excitation wiring 34. A difference between the auxiliary wiring portions 44B and the auxiliary wiring portions 34B is that the parallel auxiliary wiring portions 44Bap and 44Bbp are arranged to sandwich the plurality of main wiring portions 34A from the both sides as viewed in plan view In the semiconductor device 1E the intensity of the calibration magnetic field applied to the magnetosensitive portion 3a can be increased similarly to the semiconductor device 1D. Further, similar to the semiconductor device 1C, since the plurality of auxiliary wiring portions 44B are arranged symmetrically in the non-overlapping region regarding the magnetosensitive portion 3a, a calibration magnetic field having more uniform intensity can be applied to the magnetosensitive portion 3a. Accordingly, peripheral circuits can be less affected by the heat generated in the plurality of auxiliary wiring portions 44B.

In the configuration example of the above-mentioned semiconductor device 1E, the distance between the plurality of main wiring portions 34A and a parallel auxiliary wiring portion 44Bap is same as the distance between the plurality of main wiring portions 34A and a parallel auxiliary wiring portion 44Bbp. However, the semiconductor device 1E is not limited to this configuration example. The semiconductor device 1E may be constituted such that the distance between the plurality of main wiring portions 34A and the parallel auxiliary wiring portion 44Bap is different from the distance between the plurality of main wiring portions 34A and the parallel auxiliary wiring portion 44Bbp.

Sixth Embodiment

Figure 11:
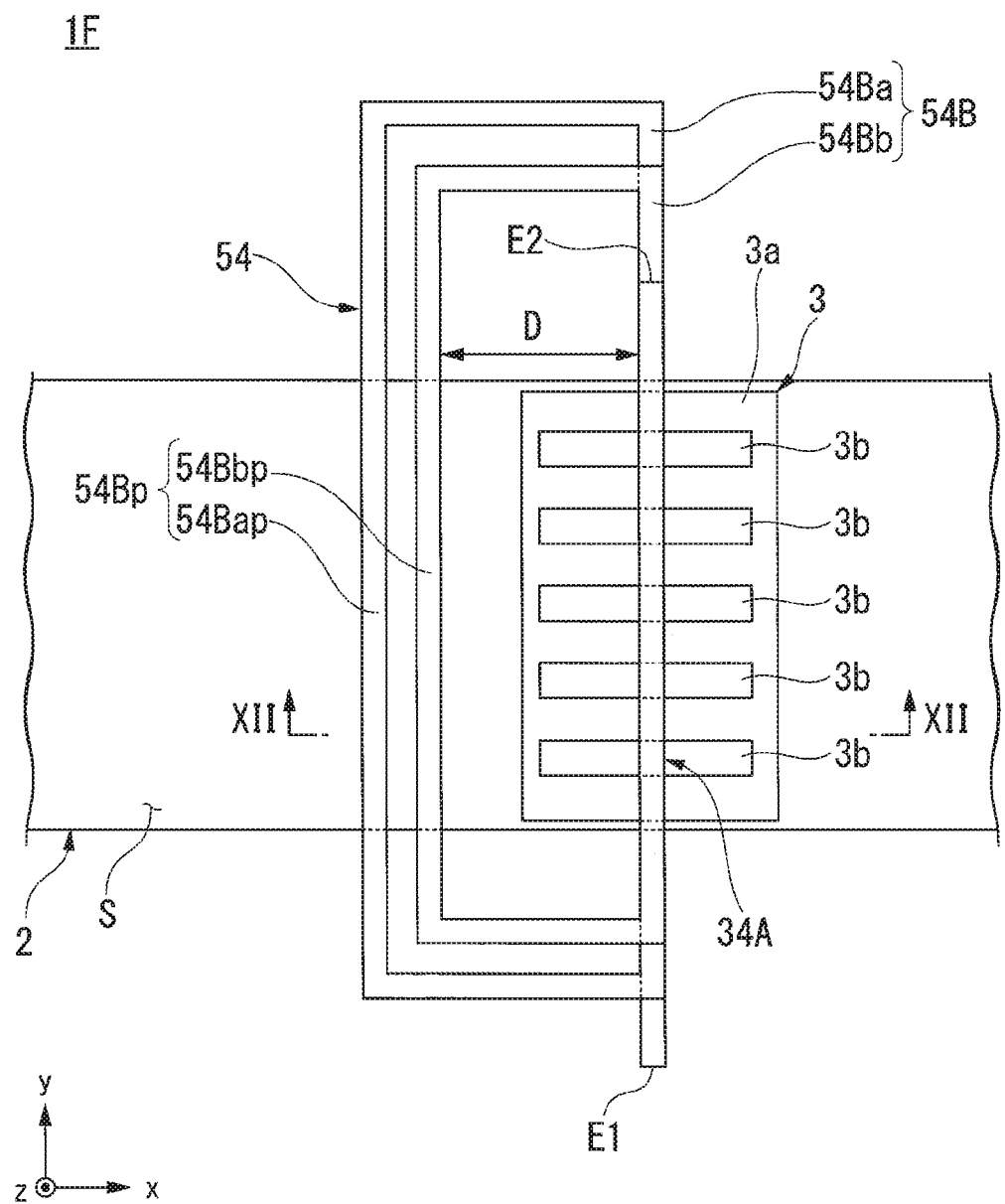
FIG. 11 is a plan view for illustrating a configuration of a semiconductor device according to the sixth embodiment of the present invention.
Figure 12:
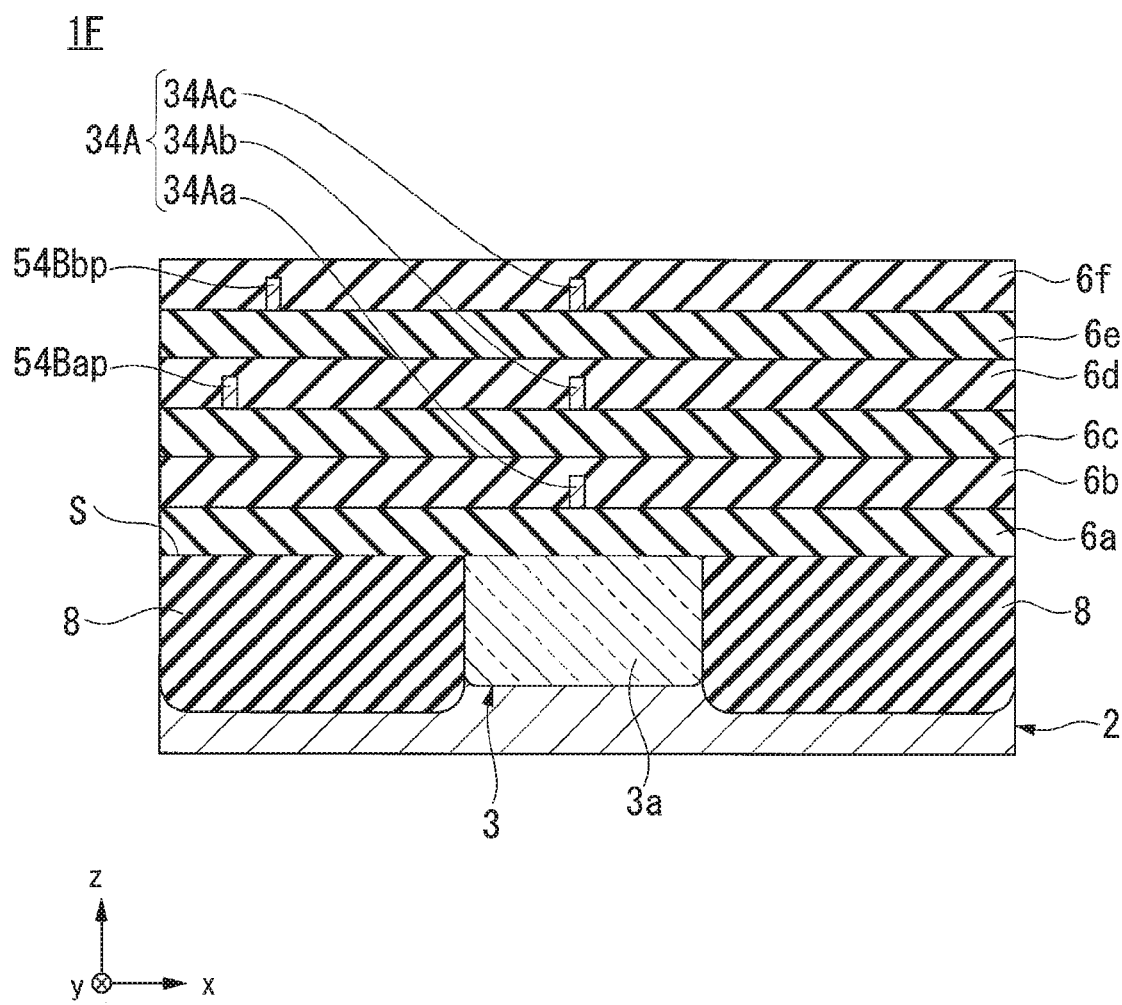
FIG. 12 is a sectional view taken along the line XII-XII of the semiconductor device according to the sixth embodiment.

FIG. 11 is a plan view for illustrating a configuration of a semiconductor device 1F according to the sixth embodiment of the present invention. FIG. 12 is a sectional view of the semiconductor device 1F taken along the line XII-XII of FIG. 11 (XII-XII sectional view). In FIG. 11, similarly to FIG. 7, the insulating layers 6a to 6f are omitted for ease of description.

The semiconductor device 1F differs from the semiconductor device 1D in that an excitation wiring 54 is provided in place of the excitation wiring 34, but other components thereof are substantially the same as those of the semiconductor device 1D. In the following description, equivalent components to those of the semiconductor device 1D are denoted by identical reference symbols, and duplicate description thereof is omitted.

The semiconductor device 1F includes the semiconductor substrate 2, the vertical Hall element 3, and an excitation wiring 54 formed of a single wiring with a plurality of turns. The excitation wiring 54 includes the plurality of main wiring portions 34A arranged in the overlapping region, and a plurality of auxiliary wiring portions 54B arranged in the non-overlapping region. The excitation wiring 54 forms a single wiring as same as the excitation wiring 34. The excitation wiring 54 differs from the excitation wiring 34 in that the plurality of auxiliary wiring portions 54B is provided in place of the plurality of auxiliary wiring portions 34B.

The plurality of auxiliary wiring portions 54B includes a plurality of parallel auxiliary wiring portions 54Bap and 54Bbp that are parallel to the plurality of main wiring portions 34A. Auxiliary wiring portions 54Ba and 54Bb are arranged in this order starting from the end portion E1 side of the excitation wiring 54.

The plurality of auxiliary wiring portions 54B of the excitation wiring 54 corresponds to the auxiliary wiring portions 34B in view of a correspondence to the excitation wiring 34. The difference between the auxiliary wiring portions 54B and the auxiliary wiring portions 34B is that the parallel auxiliary wiring portions 54Bap and 54Bbp are arranged at the different positions as viewed in plan view. More specifically, at least a portion of the parallel auxiliary wiring portions 54Bap and 54Bbp is insulated by an insulating layer A portion of the auxiliary wiring portion 54Ba and 54Bb parallel to the plurality of main wiring portions 34A is herein referred to as "parallel auxiliary wiring portion 54Bap and 54Bbp", respectively. The excitation wiring 54 is the same as the excitation wiring 34 except the arrangement of the auxiliary wiring portions 54Ba and 54Bb. The auxiliary wiring portions 54Ba and 54Bb are hereinafter collectively referred to as "plurality of auxiliary wiring portions 54B".

On the surface S of the semiconductor substrate 2, the insulating layers 6a to 6f are laminated. In the semiconductor device 1F illustrated in FIG. 12, the insulating layer 6a is formed to cover the surface S of the semiconductor substrate 2. The main wiring portions 34Aa is provided on the insulating layer 6a. The insulating layer 6b is formed on the insulating layer 6a to cover the main wiring portion 34Aa. The insulating layer 6c is formed on the insulating layer 6b. The main wiring portion 34Ab and the parallel auxiliary wiring portions 54Bap are provided on the insulating layer 6c. The insulating layer 6d is formed on the insulating layer 6c to cover the main wiring portion 34Ab and the parallel auxiliary wiring portions 54Bap. The insulating layer 6e is formed on the insulating layer 6d. The main wiring portion 34Ac and the parallel auxiliary wiring portions 54Bbp are provided on the insulating layer 6e. The insulating layer 6f is formed to cover the main wiring portion 34Ac and the parallel auxiliary wiring portions 54Bbp.

In the semiconductor device 1F, since a larger current flowing through the excitation wiring 54 can be obtained by forming a wider excitation wiring 54, the intensity of the magnetic field applied to the magnetosensitive portion 3a can be increased. When the current of the same magnitude as before is provided to the wider excitation wiring 54, the heat generation decreases according to the reduction of the resistance of the wider excitation wiring 54, permitting the suppression of the influence to the peripheral circuit caused by the generated heat.

Further in the semiconductor device 1F, since the plurality of auxiliary wiring portions 54B is arranged on the different insulating layers, overlapping of the plurality of auxiliary wiring portions 54B is possible as viewed in plan view, permitting the reduction of the area occupied by the plurality of auxiliary wiring portions 54B In the above-mentioned semiconductor device 1F, in the cross-section of FIG. 12, the parallel auxiliary wiring portion 54Bap is provided closer to the magnetosensitive portion 3a in the depth direction of the insulating layer. However, the semiconductor device 1F is not limited to this example, and the parallel auxiliary wiring portions 54Bap and 54Bbp can be freely arranged.

Seventh Embodiment

Figure 13:
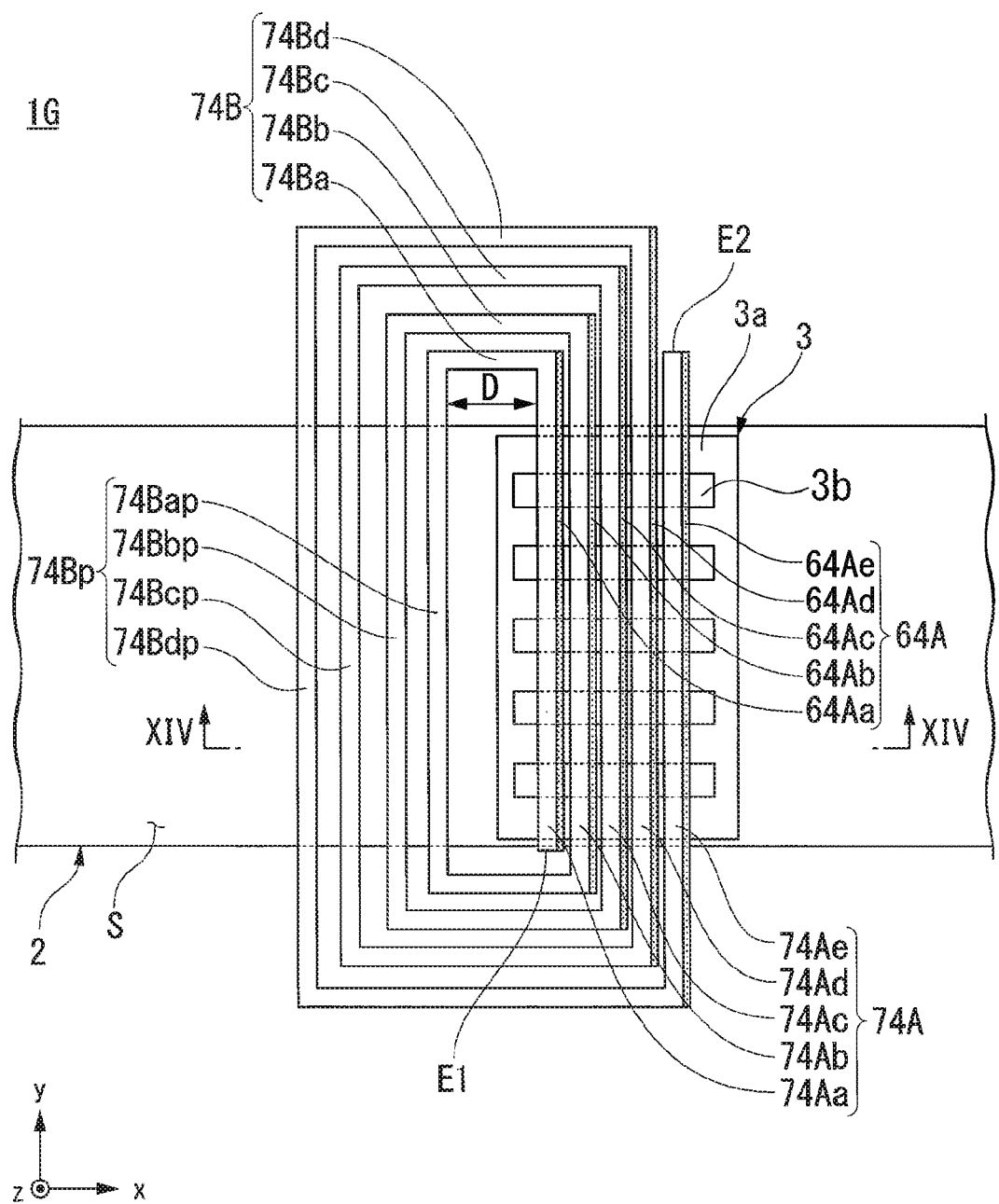
FIG. 13 is a plan view for illustrating a configuration of a semiconductor device according to the seventh embodiment of the present invention.
Figure 14:
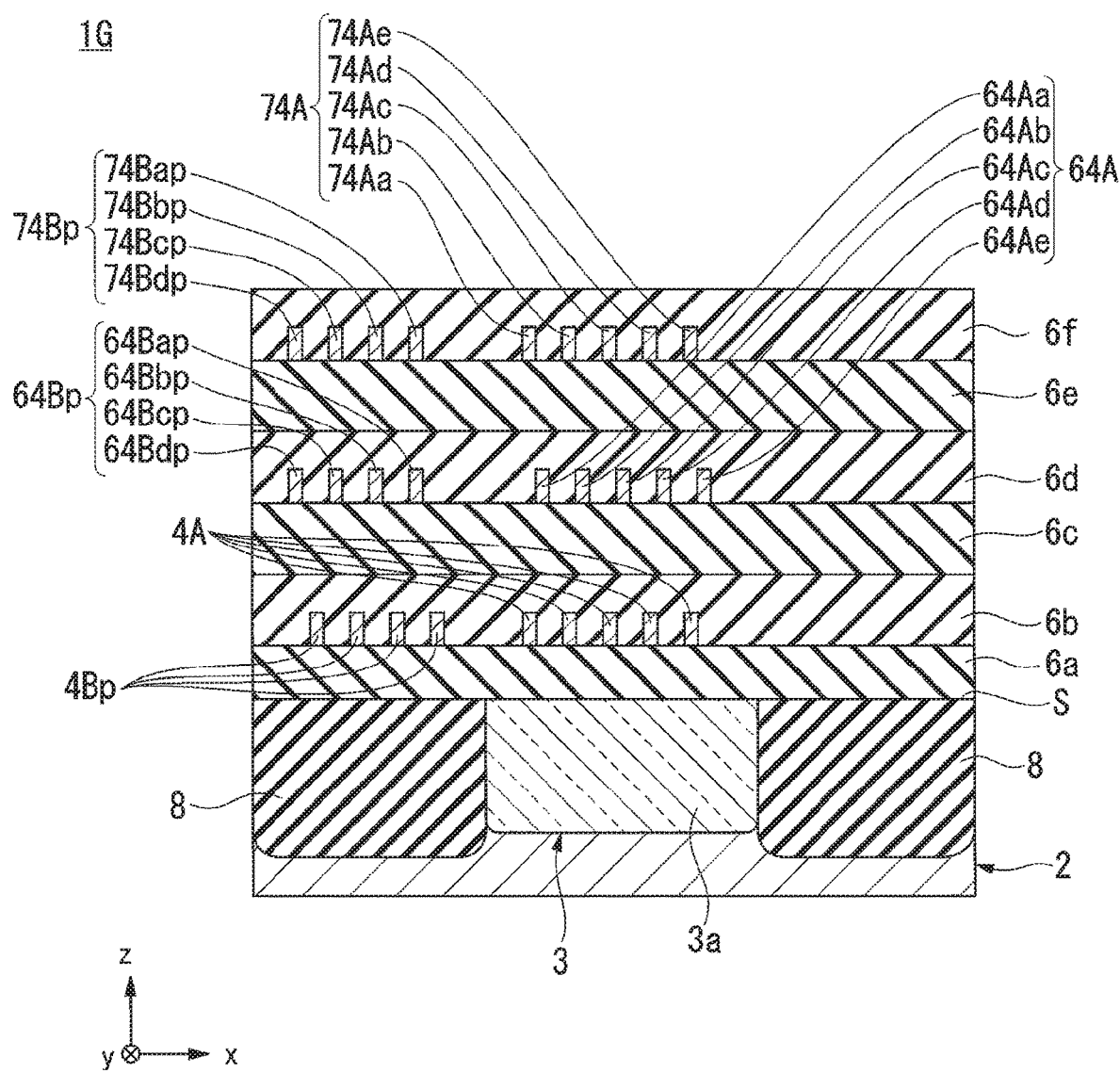
FIG. 14 is a sectional view taken along the line XIV-XIV of the semiconductor device according to the seventh embodiment.

FIG. 13 is a plan view for illustrating a configuration of a semiconductor device 1G according to a seventh embodiment of the present invention. FIG. 14 is a sectional view of the semiconductor device 1G taken along the line XIV-XIV of FIG. 13 (XIV-XIV sectional view). In FIG. 13, the insulating layers 6a to 6f are omitted for ease of description.

The semiconductor device 1G differs from the semiconductor device 1A in that excitation wirings 64 and 74 are further provided, but other components thereof are substantially the same as those of the semiconductor device 1A. In the following description, equivalent components to those of the semiconductor device 1A are denoted by identical reference symbols, and duplicate description thereof is omitted.

The semiconductor device 1G includes the semiconductor substrate 2, the vertical Hall element 3, and the excitation wiring 64 and the excitation wiring 74 each formed of a single wiring with a plurality of turns.

Similar to the excitation wiring 4, the excitation wiring 64 includes a plurality of main wiring portions 64A arranged in the overlapping region and a plurality of auxiliary wiring portions 64B arranged in the non-overlapping region. The main wiring portions 64A correspond to the main wiring portions 4A, and the auxiliary wiring portions 64B correspond to the auxiliary wiring portions 4B in view of a correspondence to the excitation wiring 4.

The excitation wiring 64 differs from the excitation wiring 4 at the point where the excitation wiring 64 is arranged apart from the magnetosensitive portion 3a along the depth direction of the insulating layers. The excitation wiring 64 is substantially the same as the excitation wiring 4 except the arrangement along the depth direction of the insulating layers.

Similar to the excitation wiring 4, the excitation wiring 74 includes a plurality of main wiring portions 74A arranged in the overlapping region and a plurality of auxiliary wiring portions 74B arranged in the non-overlapping region. The main wiring portions 74A correspond to the main wiring portions 4A, and the auxiliary wiring portions 74B correspond to the auxiliary wiring portions 4B in view of a correspondence to the excitation wiring 4.

The excitation wiring 74 differs from the excitation wiring 4 at the point where the excitation wiring 64 is arranged apart from the magnetosensitive portion 3a along the depth direction of the insulating layers. The excitation wiring 74 is substantially the same as the excitation wiring 4 except the arrangement along the depth direction of the insulating layers.

The plurality of main wiring portions 64A includes main wiring portions 64Aa, 64Ab, 64Ac, 64Ad, and 64Ae in this order starting from the end portion E1 side. The main wiring portions 64Aa, 64Ab, 64Ac, 64Ad, and 64Ae are hereinafter collectively referred to as "plurality of main wiring portions 64A".

The plurality of main wiring portions 74A includes main wiring portions 74Aa, 74Ab, 74Ac, 74Ad, and 74Ae in this order starting from the end portion E1 side. The main wiring portions 74Aa, 74Ab, 74Ac, 74Ad, and 74Ae are hereinafter collectively referred to as "plurality of main wiring portions 74A".

The plurality of auxiliary wiring portions 64B includes auxiliary wiring portions 64Ba, 64Bb, 64Bc, and 64Bd arranged in this order starting from the end portion E1 side of the excitation wiring 64. The auxiliary wiring portions 64Ba, 64Bb, 64Bc, and 64Bd are hereinafter collectively referred to as "plurality of auxiliary wiring portions 64B".

A plurality of auxiliary wiring portions 74B includes auxiliary wiring portions 74Ba, 74Bb, 74Bc, and 74Bd arranged in this order starting from the end portion E1 side of the excitation wiring 74. The auxiliary wiring portions 74Ba, 74Bb, 74Bc, and 74Bd are hereinafter collectively referred to as "plurality of auxiliary wiring portions 74B".

Of the auxiliary wiring portion 64Ba, a portion parallel to the plurality of main wiring portions 64A is a parallel auxiliary wiring portion 64Bap. Of the auxiliary wiring portion 64Bb, a portion parallel to the plurality of main wiring portions 64A is a parallel auxiliary wiring portion 64Bbp. Of the auxiliary wiring portion 64Bc, a portion parallel to the plurality of main wiring portions 64A is a parallel auxiliary wiring portion 64Bcp. Of the auxiliary wiring portion 64Bd, a portion parallel to the plurality of main wiring portions 64A is a parallel auxiliary wiring portion 64Bdp.

Of the auxiliary wiring portion 74Ba, a portion parallel to the plurality of main wiring portions 74A is a parallel auxiliary wiring portion 74Bap. Of the auxiliary wiring portion 74Bb, a portion parallel to the plurality of main wiring portions 74A is a parallel auxiliary wiring portion 74Bbp. Of the auxiliary wiring portion 74Bc, a portion parallel to the plurality of main wiring portions 74A is a parallel auxiliary wiring portion 74Bcp. Of the auxiliary wiring portion 74Bd, a portion parallel to the plurality of main wiring portions 74A is a parallel auxiliary wiring portion 74Bdp.

On the surface S of the semiconductor substrate 2, the insulating layers 6a to 6d are laminated. In the semiconductor device 1G illustrated in FIG. 14, the insulating layer 6a is formed to cover the surface S of the semiconductor substrate 2. The excitation wiring 4 is provided on the insulating layer 6a. The insulating layer 6b is formed on the insulating layer 6a to cover the excitation wiring 4. The insulating layer 6c is formed on the insulating layer 6b. The excitation wiring 64 is provided on the insulating layer 6c. The insulating layer 6d is formed on the insulating layer 6c to cover the excitation wiring 64. The insulating layer 6e is formed on the insulating layer 6d. The excitation wiring 74 is provided on the insulating layer 6d. The insulating layer 6f is formed on the insulating layer 6e to cover the excitation wiring 74.

In the semiconductor device 1G, it is possible to enhance the effect which the semiconductor device 1A brings a calibration magnetic field having a higher magnetic field intensity can be applied to the magnetosensitive portion 3a. The accuracy of estimating an actual sensitivity of the vertical Hall element 3 can thus be improved.

The above-mentioned semiconductor device 1G includes the three excitation wirings, but the present invention is not limited to this example. The semiconductor device 1G may include a plurality of excitation wirings arranged side by side in the direction perpendicular to the surface S.

Further, in the semiconductor device 1G, the three independent excitation wirings 4, 64, and 74 are provided, but the excitation wirings 4, 64, and 74 do not have to be independent to one another. At least some of the excitation wirings 4, 64, and 74 may be connected in series. The semiconductor device 1G may include, for example, a single excitation wiring obtained by connecting all the excitation wirings 4, 64, and 74 in series, or include two independent excitation wirings: the series-connected excitation wirings 4 and 64, and the excitation wiring 74.

In the above-mentioned semiconductor device 1G, all the pluralities of parallel auxiliary wiring portions 4Bp, 64Bp, and 74Bp are arranged in the same direction with respect to the magnetosensitive portion 3a as viewed in plan view, but the present invention is not limited to this example. The parallel auxiliary wiring portions can be arranged to sandwich the magnetosensitive portion 3a as viewed in plan view.

The exemplary embodiments of the present invention are described in detail above using the accompanying FIGS. 1 to 14, but the present invention is not limited to any of the embodiments. For example, the material and dimension given in the foregoing description are merely examples, and the present invention is not limited thereto. The above-mentioned embodiments may be implemented in other various modes, and various kinds of omissions, replacements, and modifications can be made without departing from the gist of the invention.

In the embodiments described above the excitation wirings 4, 14, 24, 34, 54, 64, and 74 are exemplified to be a single wiring, though, as long as an excitation wiring is electrically connected in series, different materials may be appropriately combined.

For example, in the illustrated configuration of the above-mentioned embodiments, the pluralities of main wiring portions 4A, 14A, 64A, and 74A are provided at the same distance from the surface S of the semiconductor substrate 2, but the semiconductor devices 1A, 1B, 1C, and 1G are not limited to this condition. In the semiconductor devices 1A, 1B, 1C, and 1G, each of the main wiring portions of the pluralities of the main wiring portions 4A, 14A, 64A, and 74A may be provided on the surface of the same insulating layer to have the same distance from the surface of the semiconductor substrate 2 or provided on the surface of the different insulating layers to have the different distances.

In the embodiments described above, the insulating layers are shown to have the same thickness in each configuration of the drawings. But the semiconductor devices 1A, 1B, 1C, 1D, 1E, 1F, and 1G are not limited to this condition. The thickness of the insulating layers in these semiconductor devices may be the same or different layer by layer.

In the embodiments of the semiconductor devices 1A, 1B, 1C, 1D, 1E, and 1G, each of the parallel auxiliary wiring portions 4Bp, 14Bp, 24Bp, 34Bp, 44Bp, and 74Bp is arranged at the same position along the depth direction, but these semiconductor devices are not limited to this condition. In each of the parallel auxiliary wiring portions 4Bp, 14Bp, 24Bp, 34Bp, 44Bp, and 74Bp, the parallel auxiliary wiring portions belonging to the same excitation wiring may be arranged at different positions along the width direction by disposing on the surface of the different insulating layers.

In the explanation of the embodiments of the semiconductor devices 1A, 1B, 1C, 1D, and 1G, each of the excitation wirings 4, 14, 24, 34, 64, and 74 is shown to have the configuration in which at least a portion of the parallel auxiliary wiring portions and a portion of the plurality of main wiring portions are arranged at the same position along the depth direction, but these semiconductor devices are not limited to this condition. The parallel auxiliary wiring portions of the plurality of auxiliary wiring portions and the plurality of main wiring portions may be arranged at different positions along the width direction by disposing on the surface of the different insulating layers.

Those embodiments and variations thereof are included in the scopes of the invention described in the appended claims and their equivalents in the same way as those are included in the scope and gist of the invention.

What is claimed is:

1. A semiconductor device comprising:
   a semiconductor substrate;
   a vertical Hall element having a magnetosensitive portion, and formed in the semiconductor substrate; and
   an excitation wiring provided above a surface of the semiconductor substrate and apart from the magnetosensitive portion,
   the excitation wiring comprising a single wiring with a plurality of turns,
   the single wiring of the excitation wiring having:
      a plurality of main wiring portions arranged side by side and apart from one another in an overlapping region that overlaps the magnetosensitive portion as viewed in a plan view from a direction orthogonal to the surface of the semiconductor substrate; and
      auxiliary wiring portions connecting each of the plurality of main wiring portions to one another in series and arranged in a non-overlapping region outside the magnetosensitive portion as viewed in the plan view,
      wherein portions of the auxiliary wiring portions parallel to the plurality of main wiring portions as viewed in the plan view are arranged to sandwich the magnetosensitive portion, and
      the width of the plurality of main wiring portions is smaller than the width of the magnetosensitive portion, in a direction in which the plurality of main wiring portions are separated.

2. The semiconductor device according to claim 1, wherein each of the plurality of main wiring portions is arranged along a direction parallel to the surface of the semiconductor substrate.

3. The semiconductor device according to claim 1, wherein each of the plurality of main wiring portions is arranged along the direction orthogonal to the surface of the semiconductor substrate.

4. The semiconductor device according to claim 1, wherein at least a part of the auxiliary wiring portions is arranged closer to the surface of the semiconductor substrate than a main wiring portion closest to the surface of the semiconductor substrate among the plurality of main wiring portions.

5. The semiconductor device according to claim 1, wherein the excitation wiring includes a plurality of the single wirings.

6. The semiconductor device according to claim 1, wherein a distance between the excitation wiring other than the main wiring portions is wider than a distance between the main wiring portions.

* * * * *